US009351423B2

(12) United States Patent
Ishino et al.

(10) Patent No.: US 9,351,423 B2
(45) Date of Patent: May 24, 2016

(54) SEMICONDUCTOR DEVICE AND SEMICONDUCTOR DEVICE CONNECTION STRUCTURE

(71) Applicant: DENSO CORPORATION, Kariya, Aichi-pref. (JP)

(72) Inventors: Hiroshi Ishino, Okazaki (JP); Tomokazu Watanabe, Anjo (JP)

(73) Assignee: DENSO CORPORATION, Kariya (JP)

( * ) Notice: Subject to any disclaimer, the term of this patent is extended or adjusted under 35 U.S.C. 154(b) by 24 days.

(21) Appl. No.: 14/401,638

(22) PCT Filed: Jun. 20, 2013

(86) PCT No.: PCT/JP2013/003847
§ 371 (c)(1),
(2) Date: Nov. 17, 2014

(87) PCT Pub. No.: WO2014/002442
PCT Pub. Date: Jan. 3, 2014

(65) Prior Publication Data
US 2015/0131232 A1    May 14, 2015

(30) Foreign Application Priority Data

Jun. 29, 2012  (JP) ................................. 2012-147426
Jun. 29, 2012  (JP) ................................. 2012-147427

(51) Int. Cl.
*H05K 7/20*      (2006.01)
*H01L 23/433*    (2006.01)
(Continued)

(52) U.S. Cl.
CPC .......... *H05K 7/2039* (2013.01); *H01L 23/4334* (2013.01); *H01L 23/492* (2013.01);
(Continued)

(58) Field of Classification Search
CPC ..... H05K 7/2039; H05K 7/2089; H05K 1/11; H05K 1/185; H01L 2924/13055; H01L 25/071
See application file for complete search history.

(56) References Cited

U.S. PATENT DOCUMENTS 7,961,472 B2*   6/2011  Tokuyama ............ H02M 7/003
                                                       257/706
8,081,472 B2*  12/2011  Tokuyama ............ H02M 7/003
                                                       257/713
(Continued)

FOREIGN PATENT DOCUMENTS

JP    2001-168278 A    6/2001
JP    2003-031765 A    1/2003
(Continued)

OTHER PUBLICATIONS
International Search Report of the International Searching Authority mailed Sep. 17, 2013 in the corresponding PCT application No. PCT/JP2013/003847 (and English translation).
(Continued)

*Primary Examiner* — Gregory Thompson
(74) *Attorney, Agent, or Firm* — Posz Law Group, PLC

(57) ABSTRACT

In a semiconductor device, heat radiation plates are respectively disposed on a front surface side and a rear surface side of semiconductor chips in an upper arm and a lower arm. A lead-out conductor part includes a parallel conductor that includes a positive electrode terminal, a negative electrode terminal, and an insulating film disposed between the positive electrode terminal and the negative electrode terminal, and the positive electrode terminal and the negative electrode terminal are disposed oppositely while sandwiching the insulation film. The semiconductor chips are covered by a resin mold part, surfaces of the heat radiation plates opposite to the semiconductor chips, a part of the positive electrode terminal, and a part of the negative electrode terminal are exposed from the resin mold part, and at least a part of the parallel conductor in the lead-out conductor part enters the resin mold part.

16 Claims, 21 Drawing Sheets

(51) Int. Cl.
*H01L 23/492* (2006.01)
*H01L 25/07* (2006.01)
*H02M 7/00* (2006.01)
*H01L 25/18* (2006.01)
*H02M 7/48* (2007.01)
*H05K 1/11* (2006.01)
*H05K 1/18* (2006.01)
*H01L 23/051* (2006.01)
*H01L 23/00* (2006.01)

(52) U.S. Cl.
CPC ............... *H01L 24/97* (2013.01); *H01L 25/07* (2013.01); *H01L 25/072* (2013.01); *H01L 25/18* (2013.01); *H02M 7/003* (2013.01); *H02M 7/48* (2013.01); *H05K 1/11* (2013.01); *H05K 1/185* (2013.01); *H01L 23/051* (2013.01); *H01L 24/06* (2013.01); *H01L 24/32* (2013.01); *H01L 24/33* (2013.01); *H01L 24/48* (2013.01); *H01L 24/73* (2013.01); *H01L 24/83* (2013.01); *H01L 2224/04026* (2013.01); *H01L 2224/04042* (2013.01); *H01L 2224/06181* (2013.01); *H01L 2224/32245* (2013.01); *H01L 2224/33* (2013.01); *H01L 2224/33181* (2013.01); *H01L 2224/48247* (2013.01); *H01L 2224/73215* (2013.01); *H01L 2224/73265* (2013.01); *H01L 2224/8346* (2013.01); *H01L 2224/83424* (2013.01); *H01L 2224/83447* (2013.01); *H01L 2224/97* (2013.01); *H01L 2924/1033* (2013.01); *H01L 2924/10253* (2013.01); *H01L 2924/10271* (2013.01); *H01L 2924/10272* (2013.01); *H01L 2924/12032* (2013.01); *H01L 2924/13055* (2013.01); *H01L 2924/13091* (2013.01); *H01L 2924/181* (2013.01); *H01L 2924/30107* (2013.01); *H01L 2924/351* (2013.01)

(56) References Cited

U.S. PATENT DOCUMENTS

| | | |
|---|---|---|
| 2002/0011363 A1 | 1/2002 | Shirakawa et al. |
| 2002/0034087 A1 | 3/2002 | Suzuki et al. |
| 2003/0031038 A1 | 2/2003 | Shirakawa et al. |
| 2007/0018197 A1 | 1/2007 | Mochida et al. |
| 2007/0252169 A1 | 11/2007 | Tokuyama et al. |
| 2010/0165577 A1 | 7/2010 | Tokuyama et al. |
| 2012/0008280 A1 | 1/2012 | Tokuyama et al. |
| 2013/0062751 A1* | 3/2013 | Takagi ............... H01L 23/3675 257/692 |
| 2013/0119525 A1* | 5/2013 | Tsuyuno ............... B60L 1/003 257/675 |
| 2013/0265724 A1* | 10/2013 | Kaneko ............... H01L 21/50 361/715 |
| 2014/0110752 A1* | 4/2014 | Fujino ............... H01L 25/18 257/133 |

FOREIGN PATENT DOCUMENTS

| | | |
|---|---|---|
| JP | 2005-236108 A | 9/2005 |
| JP | 2006-222149 A | 8/2006 |
| JP | 3941728 B2 | 4/2007 |
| JP | 2010-124691 A | 6/2010 |
| JP | 4525631 B2 | 6/2010 |

OTHER PUBLICATIONS

Written Opinion of the International Searching Authority mailed Sep. 17, 2013 in the corresponding PCT application No. PCT/JP2013/003847 (and English translation).

Office Action mailed Sep. 2, 2014 in a corresponding JP application No. 2012-147427 (and English translation).

* cited by examiner

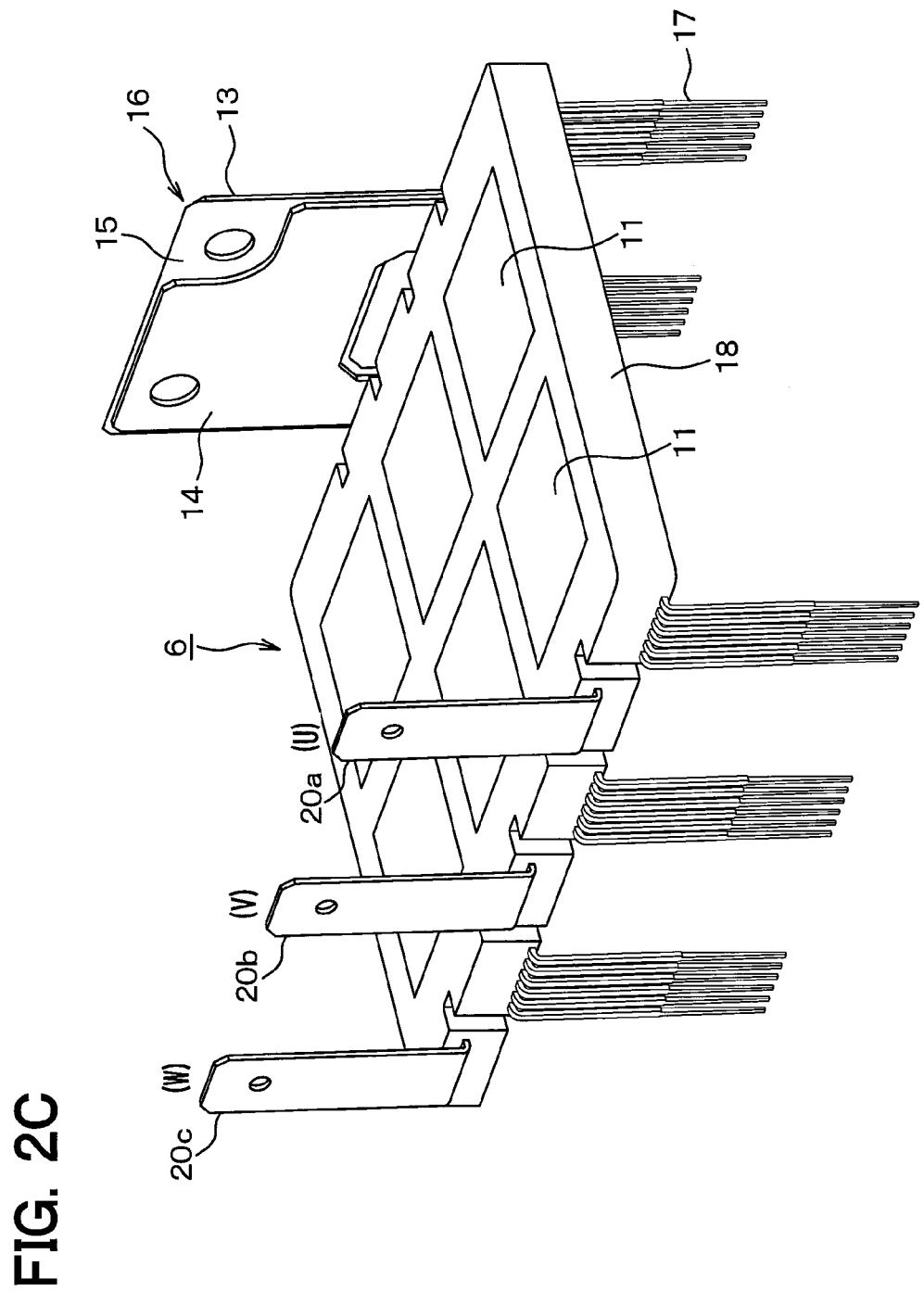

INSIDE RESIN

OUTSIDE RESIN

SEMICONDUCTOR DEVICE AND SEMICONDUCTOR DEVICE CONNECTION STRUCTURE

CROSS REFERENCE TO RELATED APPLICATION

The present disclosure is a U.S. national stage application of International Patent Application No. PCT/JP2013/003847 filed on Jun. 20, 2013 and is based on Japanese Patent Application No. 2012-147426 filed Jun. 29, 2012 and Japanese Patent Application No. 2012-147427 filed Jun. 29, 2012, the entire contents of which are incorporated herein by reference.

TECHNICAL FIELD

The present disclosure relates to a semiconductor device and a semiconductor device connection structure.

BACKGROUND

Conventionally, as a semiconductor device that includes a bridge circuit provided with semiconductor switching elements respectively disposed at an upper arm and a lower arm, a power converter that includes three-phase inverter circuit of a U-phase, a V-phase, and a W-phase are known (see Patent Literature 1). The power converter includes power semiconductor elements disposed at an upper arm and a lower arm of each of the three phases and converts a direct current into an alternating current by switching operations of the power semiconductor elements.

In the power converter, a quadrangular plate-shaped parallel conductor in which a positive electrode terminal and a negative electrode terminal are bonded while sandwiching an insulating film is used as an input terminal. At one side of the parallel conductor, an input bus bar constituting a part of a positive electrode side wiring (hereafter, referred to as a positive electrode input bus bar) and an input bus bar constituting a part of a negative electrode side wiring (hereafter, referred to as a negative electrode input bus bar) are extended in parallel with each other while being separated from each other by a predetermined distance. In addition, the power semiconductor elements of the upper arms for the three phases are disposed at equal intervals on the positive electrode input bus bar, and the power semiconductor elements of the lower arms for the three phases are disposed at equal intervals on the negative electrode input bus bar. Then, output bus bars for the three phases are extended perpendicular to the input bus bars so as to connect the upper arms and the lower arms of the respective phases. The upper arms and the lower arms of the respective phases are connected to a load supplied with the alternating current through the output bus bars.

In addition, Patent Literature 2 suggests a semiconductor device that includes a plurality of power semiconductor elements and constitutes a power converter converting a direct current into an alternating current based on switching operations of the plurality of power semiconductor elements. The semiconductor device includes a positive electrode terminal (a positive electrode side main electrode) and a negative electrode terminal (a negative electrode side main electrode) protruding in a perpendicular direction from a side of a case of the semiconductor device having a substantially quadrangular plate shape. The positive electrode terminal and the negative electrode terminal are formed of plate-shaped electrodes. The plate-shaped electrodes constituting the positive electrode terminal and the negative electrode terminal are bonded to each other while sandwiching an insulation member to form a plate-shaped conductor (a parallel conductor). Positions of leading edges of the positive electrode terminal and the negative electrode terminal are shifted, and the leading edge of the negative electrode terminal protrudes more than the leading edge of the positive electrode terminal so as to be further away from the case.

The positive electrode terminal and the negative electrode terminal configured as described above are connected to a positive electrode side direct current bus bar and a negative electrode side direct current bus bar and are connected to a smoothing capacitor through the bus bars. Specifically, the positive electrode side direct current bus bar and the negative electrode side direct current bus bar are formed of a plate-shaped conductor and a leading edge of the positive electrode side direct current bus bar protrudes more than a leading edge of the negative electrode side direct current bus bar. When the negative electrode side direct current bus bar is disposed on the negative electrode terminal, which protrudes more between both terminals of the semiconductor, the leading edge of the positive electrode side direct current bus bar, which protrudes more than the negative electrode side direct current bus bar, is disposed on the positive electrode terminal. Base on this, at the leading edge of the negative electrode terminal and the leading edge of the positive electrode side direct current bus bar, the negative electrode terminal and the negative electrode side direct current bus bar are brazed, and the positive electrode terminal and the positive electrode side direct current bus bar are brazed so as to provide electrical and mechanical connections.

PATENT LITERATURE

Patent Literature 1: JP 3793407 B2 (corresponding to US 2002/034087 A1)

Patent Literature 2: JP 2010-124691A

As a simple model illustrated in FIG. 22, for example, a semiconductor device including a three-phase inverter circuit includes bridge circuits J3 of three phases. Each of the bridge circuits J3 includes a parallel connection of a semiconductor switching element J1, such as an IGBT, and a freewheel diode (hereafter, referred to as FWD) J2 in each of an upper arm and a lower arm. An L load J4, such as a motor, is connected to a position between the upper and lower arms in the bridge circuit J3 included in the semiconductor device, and a smoothing capacitor J5 is connected in parallel with the bridge circuit J3. By switching on-off of the semiconductor switching elements J1 in the upper arm and the lower arm, a direct current supplied from a direct current power source J6 is converted into an alternating current and is supplied to the L load J4. States of a drain-source current Ids, a drain-source voltage Vds, and a switching loss Esw at this time are as illustrated in FIG. 23.

In a circuit configuration as described above, a short-circuit loop of the upper and the lower arm shown by the arrow in FIG. 22 is formed. When the semiconductor switching element J1 on the lower arm side is switched from on to on, a dI/dt change in the short-circuit loop occurs.

Here, as illustrated in FIG. 23, a surge voltage ΔVsur is generated at switching. The surge voltage ΔVsur is expressed by the following expression. In the following expression, Ls indicates an inductance in the short-circuit loop.

$$\Delta Vsur = Ls \cdot dI/dt \qquad \text{(Math. 1)}$$

The surge voltage ΔVsur tends to increase due to increase in electric current and switching speed, which has been promoted recently. Although a surge protection can be achieved by increasing a breakdown voltage of elements, an on-resistance in a trade-off relationship increases, and increase in stationary loss is caused. In addition, there are needs of reducing a switching loss Esw and reducing a size of a device, and improvement of dl/dt and increase in frequency are required in order to meet the needs. Thus, in order to use under a high dl/dt environment without increasing the surge voltage ΔVsur, a reduction in inductance in the short-circuit loop is required.

In order to realize a reduction in inductance, it is effective to form parts constituting the positive electrode side wiring and parts constituting the negative electrode side wiring in the semiconductor device including the three-phase inverter circuit by parallel conductors as much as possible so that an electric current flows in opposite directions in the positive electrode and the negative electrode. Accordingly, a magnetism offset occurs between the positive electrode side wiring and the negative electrode side wiring, and a reduction in inductance can be achieved.

However, in the structure as described in Patent Literature 1, regions as parallel conductors is limited to the input terminal, and a reduction in inductance is insufficient. Specifically, in the plate-shaped conductor constituting the input terminal, a connection portion of the positive electrode terminal and the positive electrode input bus bar and a connection portion of the negative electrode terminal and the negative electrode input bus bar are completely different from each other, and the positive input bus bar and the negative input bus bar are shifted to each other and are not formed as parallel conductors. The positive electrode input bus bar and the negative electrode input bus bar are shifted in a plane direction of the respective bus bars formed into the plate-shape, and planes of the respective bus bars are not disposed oppositely. Thus, a magnetism offsetting effect by the positive electrode input bus bar and the negative electrode input bus bar is small, and a reduction in inductance cannot be achieved. In addition, because a path from the positive electrode to the negative electrode are difference among the U-phase, the V-phase, and the W-phase, variation in inductance occurs.

In the connection structure described in Patent Literature 2, as illustrated in FIG. 24, at a leading edge of a negative electrode terminal J10 and a leading edge of a positive electrode side direct current bus bar J11, the negative electrode terminal J10 and a negative electrode side direct current bus bar J12 are brazed, and a positive electrode terminal J13 and the positive electrode side direct current bus bar J11 are brazed. Thus, each of brazed portions J14, J15 are shifted in a direction parallel to a protruding direction of the positive electrode terminal J13 and the negative electrode terminal J10 from a case J16. Thus, when a vibration is applied, especially when a strong vibration occurs as when mounted in a vehicle and a stress of expansion and contraction is repeatedly generated at the brazed portions J14, J15, the stress becomes large, and a disconnection due to fatigue is likely to be caused.

Because the negative electrode terminal J10 and the negative electrode side direct current bus bar J12 need to be separated from the positive electrode terminal J13 and the positive electrode side direct current bus bar J11 in order to secure a creeping distance in response to a large current, a distance D1 between the brazed portions J14, J15 increases. In such a case, the above-described stress become larger. In contrast, it can be considered that thicknesses of insulating films J17, J18 between the negative electrode terminal J10 and the positive electrode terminal J13 and between the negative electrode side direct current bus bar J12 and the positive electrode side direct current bus bar J11 are increased to secure a creeping distance. However, when the thicknesses of the insulation films J17, J18 are increased, the effect of reduction in inductance due to a magnetism offset generated by making an electric current flow to the respective terminals J10, J13 and the respective bus bars J11, J12 on both sides thereof in opposite directions becomes weaker.

Here, the semiconductor device that includes the three-phase inverter circuit having three phases of the U-phase, the V-phase, and the W-phase, that is, a 6-in-1 structure, in which because the upper and the lower arms are provided for the respective phases, six arms are modularized into one, is described as an example. However, this indicates only one example, and a similar problem occurs, for example, in a 2-in-1 structure in which only one phase is modularized and a 4-in-1 structure in which a bridge circuit for 2 phases, such as an H bridge circuit, is modularized.

SUMMARY

An object of the present disclosure is to provide a semiconductor device that can achieve a reduction in inductance. In addition, another object of the present disclosure is to provide a semiconductor device connection structure that can improve a reliability of a connection portion of a positive electrode terminal and a negative electrode terminal while realizing a reduction in inductance, and to provide a semiconductor device to which the connection structure is applied.

A semiconductor device according to one aspect of the present disclosure includes an upper arm, a lower arm, heat radiation plates, a lead-out conductor part, and a resin mold part. Each of the upper arm and the lower arm has a semiconductor chip in which a semiconductor switching element is formed, and the semiconductor chip has a front surface and a rear surface. The heat radiation plates are respectively disposed on a front surface side and a rear surface side of the semiconductor chip in each of the upper arm and the lower arm. The lead-out conductor part includes a parallel conductor including a positive electrode terminal, a negative electrode terminal, and an insulating film. The positive electrode terminal is connected to the heat radiation plate that is connected to a positive electrode side of the semiconductor chip in the upper arm. The negative electrode terminal is connected to the heat radiation plate that is connected to a negative electrode side of the semiconductor chip in the lower arm. The insulating film is disposed between the positive electrode terminal and the negative electrode terminal. The positive electrode terminal and the negative electrode terminal are disposed oppositely while sandwiching the insulation film. The resin mold part covers the semiconductor chips while exposing surfaces of the heat radiation plates opposite from the semiconductor chips, a part of the positive electrode terminal, and a part of the negative electrode terminal, and at least a part of the parallel conductor in the lead-out conductor part enters the resin mold part.

In the semiconductor device, the lead-out conductor part formed of the parallel conductor enters the resin mold part. Thus, an area serving as the parallel conductor can be increased. Thus, an area capable of generating a magnetism offset can be increased, and a further reduction in inductance can be achieved.

A semiconductor device connection structure according to another aspect of the present disclosure includes a semiconductor device and a connection object. The semiconductor device includes a plate-shaped conductor that is formed as a parallel conductor by oppositely disposing and bonding a positive electrode terminal and a negative electrode terminal while sandwiching an insulating film, and a semiconductor switching element. The semiconductor device is modularized with resin covering the semiconductor switching element while partially exposing the plate-shaped conductor. The connection object includes a positive electrode side connection terminal and a negative electrode side connection terminal respectively connected with the positive electrode terminal and the negative electrode terminal included in the plate-shaped conductor. The positive electrode side connection terminal and the negative electrode connection terminal include a parallel conductor formed by portions extending parallel to connection portions of the positive electrode terminal and the negative electrode terminal.

The positive electrode terminal and the negative electrode terminal are exposed from the resin by partially protruding from the resin. When a direction in which the positive electrode terminal and the negative electrode terminal protrude from the resin is defined as a protruding direction, and a direction perpendicular to the protruding direction is defined as a width direction, the positive electrode terminal and the negative electrode terminal have cut-out portions at a predetermined distance from the resin in the protruding direction, and the cut-out portion of the positive electrode terminal and the cut-out portion of the negative electrode terminal are formed in opposite directions in the width direction. The positive electrode side connection terminal and the negative electrode side connection terminal have cut-out portions at portions serving as the parallel conductor, and the cut-out portions of the positive electrode side connection terminal and the negative electrode side connection terminal correspond to the cut-out portions respectively provided in the positive electrode terminal and the negative electrode terminal. In the width direction, a side of the positive electrode terminal opposite from the cut-out portion of the positive electrode terminal is connected with a side of the positive electrode side connection terminal opposite from the cut-out portion of the positive electrode side connection terminal, and a side of the negative electrode terminal opposite from the cut-out portion of the negative electrode terminal is connected with a side of the negative electrode side connection terminal opposite from the cut-out portion of the negative electrode side connection terminal.

The semiconductor device connection structure can improve a reliability of the connection portions of the positive electrode terminal and the negative electrode terminal while realizing a reduction in inductance.

BRIEF DESCRIPTION OF DRAWINGS

The above and other objects, features and advantages of the present disclosure will become more apparent from the following detailed description made with reference to the accompanying drawings. In the drawings:

FIG. 2C is a perspective view illustrating an example of a semiconductor module;

DETAILED DESCRIPTION

Figure 1:
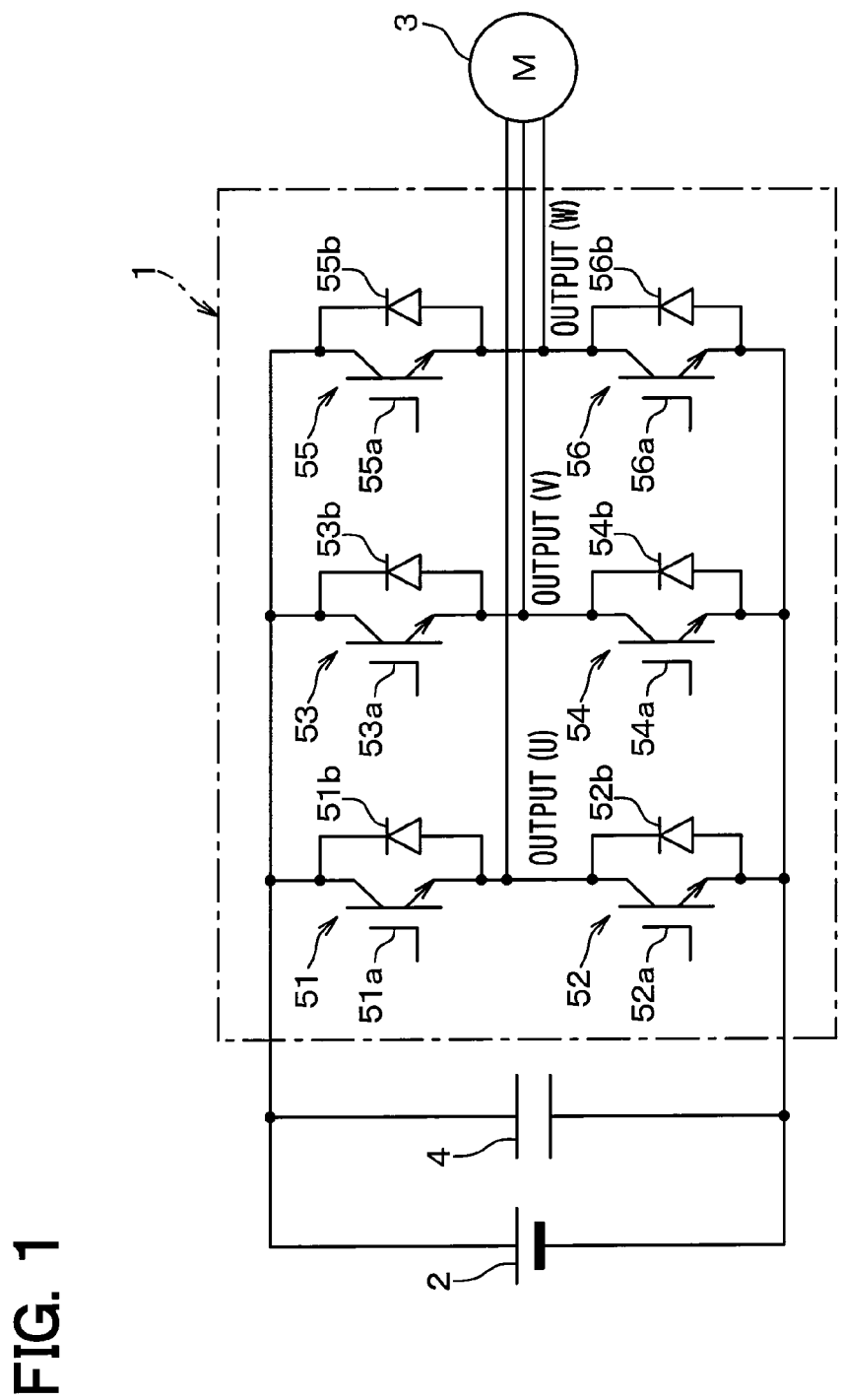
FIG. 1 is a circuit diagram of an inverter circuit to which a semiconductor module according to a first embodiment of the present disclosure is applied.

The following describes embodiments of the present disclosure with reference to the drawings. In each of the following embodiments, the same or equivalent parts are described with being designated by the same reference numerals.

First Embodiment

A first embodiment of the present disclosure is described. In the present embodiment, as an application example of a semiconductor device according to an embodiment of the present disclosure, a semiconductor module including a three-phase inverter that drives, for example, a three-phase alternating current motor is described.

Firstly, a configuration of an inverter circuit 1 included in a semiconductor module 6 is described with reference to FIG. 1. As illustrated in FIG. 1, the inverter circuit 1 drives a three-phase alternating current motor 3 as a load based on a direct current power source 2. The inverter circuit 1 is connected in parallel with a smoothing capacitor 4, and the smoothing capacitor 4 is used for reducing a ripple at switching and forming a constant power supply voltage by suppressing influence of noises.

The inverter circuit 1 has a configuration in which serially-connected upper and lower arms 51-56 are connected in parallel for three phases. The inverter circuit 1 applies middle potentials of the upper arms 51, 53, 55 and the lower arms 52, 54, 56 to respective phases of a U-phase, a V-phase, and a W-phase of the three-phase alternating current motor 3 in turn. In other words, the upper and lower arms 51-56 respectively include semiconductor switching elements 51a-56a, such as IGBTs or MOSFETs, and rectifiers (one side conductive elements) 51b-56b for backflow, such as FWDs or SBDs. By on-off control of the semiconductor switching elements 51a-56a in the upper and lower arms 51-56 of the respective phases, a three-phase alternating current is supplied to the three-phase alternating current motor 3. Accordingly, the three-phase alternating current motor 3 can be driven.

In the present embodiment, semiconductor chips in which the semiconductor switching elements 51a-51f and the rectifiers 51b-56b constituting respective six upper and lower arms 51-56 constituting the inverter circuit 1 are modularized integrally to provide a semiconductor module having a 6-in-1 structure.

Subsequently, a detailed structure of the semiconductor module 6 including the inverter circuit 1 having the above-described circuit configuration is described with reference to FIG. 2 through FIG. 6.

Figure 2A:
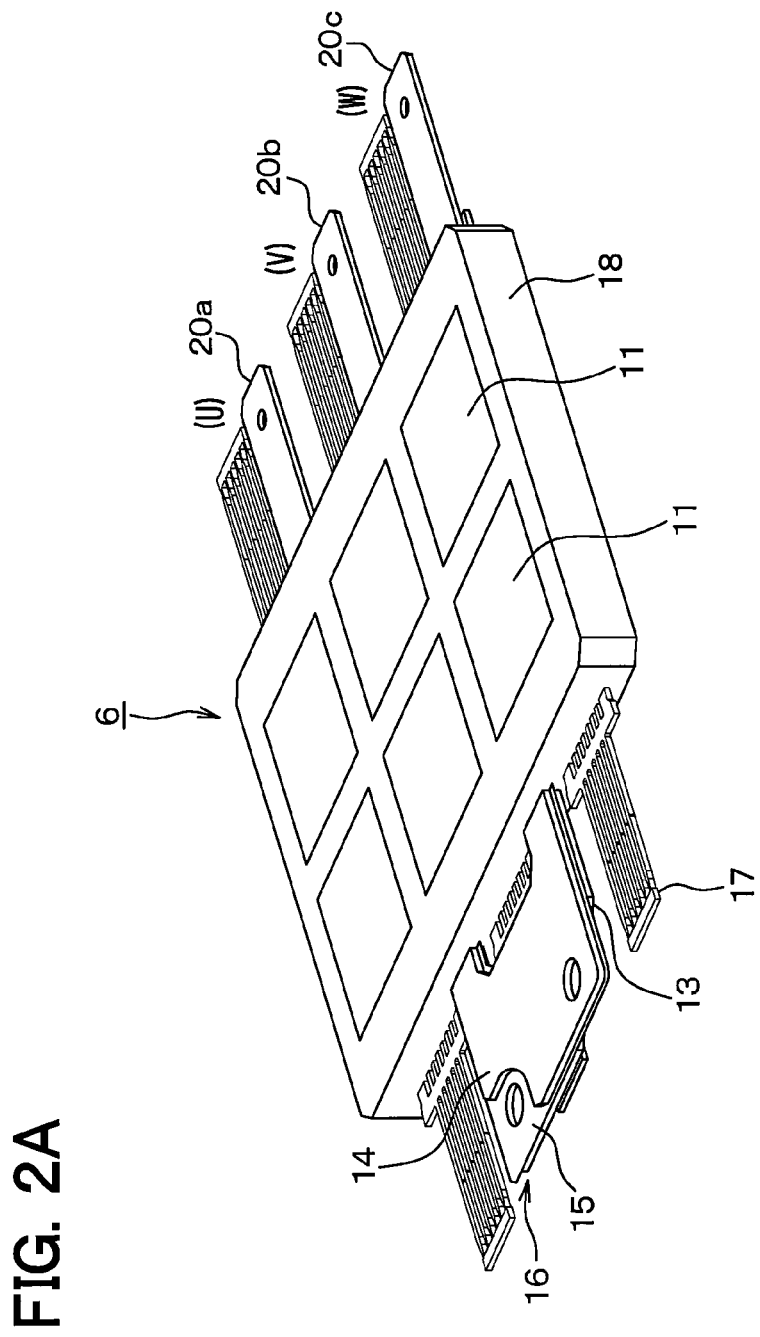
FIG. 2A is a perspective view of a semiconductor module.

The semiconductor module 6 configured as illustrated in FIG. 2A includes semiconductor chips 10, upper and lower heat radiation plates 11, 12, a plate-shaped conductor 16 in which a positive electrode terminal 13 and a negative electrode terminal 14 sandwiches an insulating film 15, and control terminals 17. In the above-described components, the semiconductor chips 10, the upper and lower heat radiation plates 11, 12, the control terminals 17 and the like are defined as a component block for one arm, and six component blocks are covered by a resin mold part 18 as illustrated in FIG. 2A. The component blocks for six arms covered by the resin mold part 18 have basic structures similar to each other although detailed structure are different from each other. Firstly, each of the components that constitute the basic structures of the component block covered by the resin mold part 18 is described.

The semiconductor chips 10 have front surfaces and rear surfaces. In the semiconductor chips 10, the semiconductor switching elements 51a-56a and the rectifiers 51b-56b constituting the upper arms 51, 53, 55 or the lower arms 52, 54, 56 are formed. For example, the semiconductor chips 10 are formed using Si, SiC, GaN, or the like as a base material. In the present embodiment, the semiconductor switching elements 51a-56a and the rectifiers 51b-56b formed in the semiconductor chips 10 are formed as vertical elements in which an electric current flows in a direction perpendicular to the substrate. Various pads are formed on the front surface side and the rear surface side of the semiconductor chips 10, and electrical connection is performed through the pads. In the present embodiment, the rear surface side of each of the semiconductor chips 10 is connected to the lower heat radiation plate 12 through a bonding material, such as solder. In addition, the front-surface side of the semiconductor chips are connected to element relay electrodes 19, which are formed using Cu, Al, Fe, or the like as base material, through bonding material such as solder, and the element relay electrodes 19 are connected to the upper heat radiation plate 11 through bonding material such as solder. Accordingly, each of the semiconductor chips 10 are electrically connected to the upper and lower heat radiation plates 11, 12.

In the present embodiment, in the semiconductor chips 10, elements such as the semiconductor switching elements 51a-56a and the rectifiers 51b-56b constituting the respective arms 51-56 are separately formed. In each of the arms 51-56, the elements may be formed in the same chip. As the bonding material, metal bonding material having a conductivity and having a thermal conductivity of 30 to 400 W/mk may be used, and for example, Ag paste may be used other than solder.

The upper and lower heat radiation plates 11, 12 correspond to heat sinks and are formed by subjecting a member mainly containing Cu, Al, Fe, or the like to a plating for connection. One surface side of each of the upper and lower heat radiation plates 11, 12 is directed toward the semiconductor chips 10, and the other surface side is exposed from the resin mold part 18. The upper heat radiation plate 11 is connected to front surface electrodes of the semiconductor switching elements 51a-56a (e.g., sources of the MOSFETs or emitters of the IGBTs) and first electrodes of the rectifiers 51b-56b (e.g., anodes of the FWDs or the SBDs) by being connected to the front surface side of the semiconductor chips 10 through the element relay electrodes 19. In addition, the lower heat radiation plate 12 is connected to rear surface electrodes of the semiconductor switching elements 51a-56a (e.g., drains of the MOSFETs or collectors of the IGBTs) and second electrodes of the rectifiers 51b-56b (e.g., cathodes of the FWDs or the SBDs) by being connected to the rear surface side of the semiconductor chips 10. The front surface side of the upper heat radiation plate 11 and the rear surface side of the lower heat radiation plate 12, that is, surfaces opposite from the surface to which the semiconductor chips 10 are disposed are exposed from the resin mold part 18 so that heat radiation can be performed at exposed portions.

In the present embodiment, the lower heat radiation plate 12 constitutes a part of a positive electrode side wiring to the respective arms 51-56, and the upper heat radiation plate 11 constitutes a part of a negative electrode side wiring to the respective arms 51-56.

A lower heat radiation plate 12 is electrically connected to the positive electrode terminal 13 and is applied with a voltage of the direct current power source 2. Although the heat radiation plate 12a has a one plate structure mounted with all of the semiconductor chips 10 constituting the three upper arms 51, 53, 55, the heat radiation plate 12a may be divided for each arm. In the present embodiment, the lower heat radiation plate 12a has the one plate structure in view of connection with the positive electrode terminal 13. As described later, the positive electrode terminal 13 is divided into two forks, and the two forks are connected to the lower heat radiation plate 12a at positions between the semiconductor chips 10 constituting the three arms 51, 53, 55. Thus, an electric current can be supplied from the direct current power source 2 to the respective phases without variation of wiring resistances among the respective phases.

On a surface of the lower heat radiation plate 12a exposed from the resin mold part 18, depressed portions 12e dividing for the respective phases are formed. Because the resin mold part 18 can enter the depressed portions 12e, a holding property of the lower heat radiation plate 12a by the resin mold part 18 can be enhanced, and an influence of a thermal stress of the lower heat radiation plate 12a can be restricted. Especially for the V-phase disposed in the middle, the thermal stress of the lower heat radiation plate 12a may be excessively large compared with the U-phase and the W-phase on the both sides. However, by enhancing the holding property of the lower heat radiation plate 12a, a thermal deformation of the lower heat radiation plate 12a can be restricted. Thus, a stress application to the semiconductor chips 10 can be restricted, and detachment of the semiconductor chips 10 and the bonding material can be restricted. A dimensional design of the lower heat radiation plate 12a is performed in such a manner that the respective regions divided by the depressed portions 12e have desired heat radiation areas. In other words, when heat is transferred from the semiconductor chips 10 to the lower heat radiation plates 12a through the element relay electrodes 19, heat diffusion occurs in the lower heat radiation plate 12a at an angle of 45 degrees. Thus, the heat radiation areas are larger than areas after the heat diffusion, that is, the heat radiation areas are at least the sum of the areas of the semiconductor chips 10 and the areas for the heat diffusion.

Upper heat radiation plates 11a-11c constitute a part of intermediate wiring connecting the upper and lower arms 51-56 of the respective phases. From the upper heat radiation plates 11a-11c, output terminals 20a-20c of the respective phases are led out.

Lower heat radiation plates 12b-12d constitute a part of intermediate wiring connecting the upper and lower arms 51-56 of the respective phases. The lower heat radiation plates 12b-12d are connected to the upper heat radiation plates 11a-11c for the respective phases through upper and lower arm relay electrodes 21 formed using Cu, Al, Fe, or the like as base material.

Dimensional designs of the upper heat radiation plates 11a-11c and the lower heat radiation plate 12c are also performed in such a manner that the respective plates have desired heat radiation areas. In other words, when heat is transferred from the semiconductor chips 10 to the lower heat radiation plate 12a through the element relay electrodes 19, heat diffusion occurs in each of the heat radiation plates 11a-11c, 12b-12d at an angle of 45 degrees. Thus, the heat radiation areas are larger than areas after the heat diffusion, that is, the heat radiation areas are at least the sum of the areas of the semiconductor chips 10 and the areas for the heat diffusion.

The upper heat radiation plate 11d is electrically connected to the negative electrode terminal 14 and is connected to the GND through the negative electrode terminal 14. Although the upper heat radiation plate 11d has a one plate structure mounted with all of the semiconductor chips 10 constituting the three lower arms 52, 54, 56, the upper heat radiation plate 11d may be divided for each arm. In the present embodiment, the upper heat radiation plate 11d has the one plate structure in view of connection with the negative electrode terminal 14. As described later, the negative electrode terminal 14 is divided into two forks, and the two forks are connected to the upper heat radiation plate 11d at positions between the semiconductor chips 10 constituting the three arms 52, 54, 56. Thus, an electric current from the respective phases can flow without variation of wiring resistances among the respective phases.

On a surface of the upper heat radiation plate 11d exposed from the resin mold part 18, depressed portions 11e dividing for the respective phases are formed. Because the resin mold part 18 can enter the depressed portions 11e, a holding property of the upper heat radiation plate 11d by the resin mold part 18 can be enhanced, and an influence of a thermal stress of the upper heat radiation plate 11d can be restricted. Especially for the V-phase disposed in the middle, the thermal stress of the upper heat radiation plate 11d may be excessively large compared with the U-phase and the W-phase on the both sides. However, by enhancing the holding property of the upper heat radiation plate 11d, a thermal deformation of the upper heat radiation plate 11d can be restricted. Thus, a stress application to the semiconductor chips 10 can be restricted, and detachment of the semiconductor chips 10 and the bonding material can be restricted. A dimensional design of the upper heat radiation plate 11d is performed in such a manner that the respective regions divided by the depressed portions 11e have desired heat radiation areas. In other words, when heat is transferred from the semiconductor chips 10 to the upper heat radiation plates 11d through the element relay electrodes 19, heat diffusion occurs in the upper heat radiation plate 11d at an angle of 45 degrees. Thus, the heat radiation areas are at least the sum of the areas of the semiconductor chips 10 and the areas for the heat diffusion.

Figure 6A:
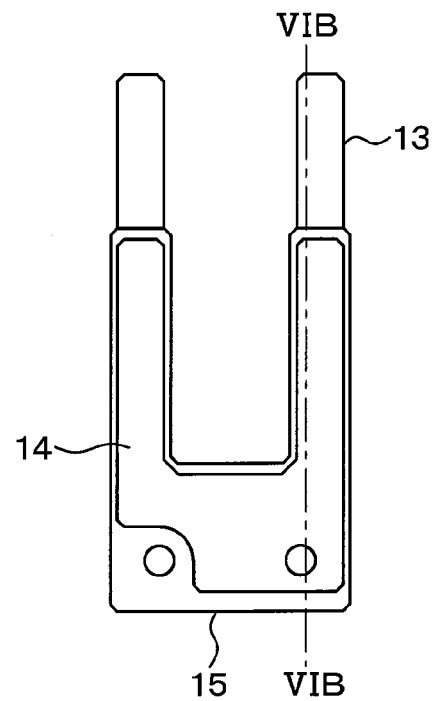
FIG. 6A is a front view of a plate-shaped conductor.
Figure 6B:
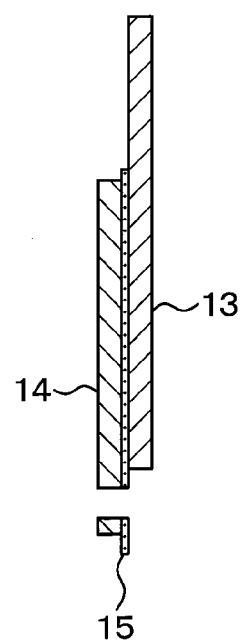
FIG. 6B is a cross-sectional view of the plate-shaped conductor taken along line VIB-VIB in FIG. 6A.

As illustrated in FIG. 6A and FIG. 6B, the plate-shaped conductor 16, which serve as a lead-out conductor constituted of the positive electrode terminal 13, the negative electrode terminal 14, and the insulation film 15, is constituted of a parallel conductor in which the positive electrode terminal 13 and the negative electrode terminal 14 are disposed oppositely while sandwiching the insulation film 15 having a predetermined thickness. The plate-shaped conductor 16 can be formed by bonding the positive electrode terminal 13 and the negative electrode terminal 14 using an adhesive agent or an adhesive sheet.

Figure 6C:
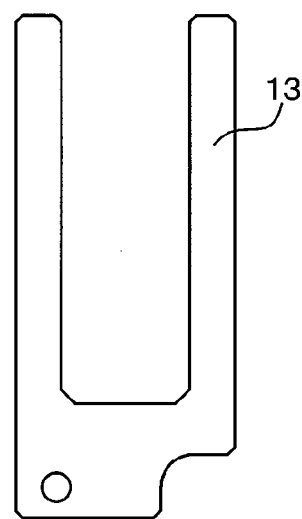
FIG. 6C is a front view of a positive electrode terminal.
Figure 6D:
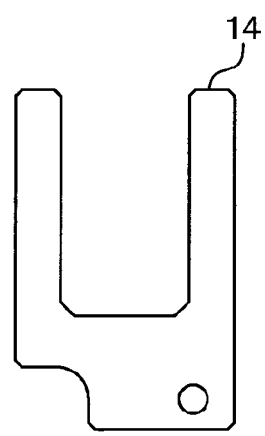
FIG. 6D is a front view of a negative electrode terminal.
Figure 6E:
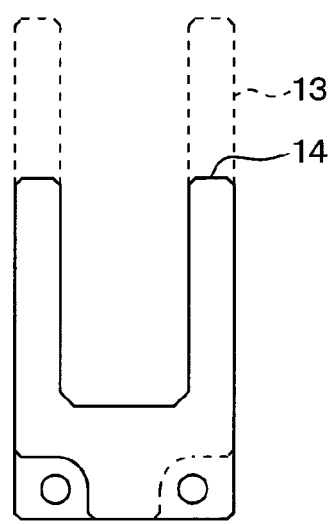
FIG. 6E is a layout diagram at when the positive electrode terminal and the negative electrode terminal are stacked.

The positive electrode terminal 13 constitutes a part of the positive electrode side wiring applied with the power supply voltage from the direct current power source 2 and has a plate shape. The positive electrode terminal 13 is connected to the lower heat radiation plate 12a through a bonding member, such as solder, or by welding. The positive electrode terminal 13 is formed of a bus bar, for example by subjecting a member mainly containing Cu, Al, Fe, or the like to a plating for connection. In the present embodiment, as illustrated in FIG. 6A, FIG. 6C, and FIG. 6E, the positive electrode terminal 13 is divided into two forks at a position covered by the resin mold part 18. The two forks are connected to portions of the lower heat radiation plate 12a between positions corresponding to the semiconductor chips 10 constituting the three arms 51, 53, 55.

The negative electrode terminal 14 constitutes a part of the negative electrode side wiring connected to the GND and has a plate shape. The negative electrode terminal 14 is connected to the upper heat radiation plate 11d through a bonding member, such as solder, or by welding. The negative electrode terminal 14 is also formed of a bus bar, for example by subjecting a member mainly containing Cu, Al, Fe, or the like to a plating for connection. In the present embodiment, as illustrated in FIG. 6A, FIG. 6D, and FIG. 6E, the negative electrode terminal 14 is also divided into two forks at a position covered by the resin mold part 18. The two forks are connected to portions of the upper heat radiation plate 11d between positions where the semiconductor chips 10 constituting the three arms 52, 54, 56 are disposed.

The insulating film 15 is formed of a plate-shaped insulator made of, for example, organic resin material, such as epoxy, silicone, polyimide, ceramic-based material, such as $Al_2O_3$, $Si_3N_4$, AlN, or glass, or mixed material obtained by mixing fillers made of, for example, the ceramic material to the organic resin material. When a direction in which the plate-shaped conductor 16 protrudes from the resin mold part 18 is defined as a protruding direction, and a direction perpendicular to the protruding direction is defined as a width direction, as illustrated in FIG. 6A, the insulation film 15 is a size larger than the positive electrode terminal 13 and the negative electrode terminal 14 in the protruding direction and the width direction. In other words, outer edge portions of the positive electrode terminal 13 and the negative electrode terminal 14 are located inside an outer edge portion of the insulation film 15, and the insulation film 15 sticks out from the positive electrode terminal 13 and the negative electrode terminal 14. By the above-described dimensional design of the insulation film 15, a creeping distance between the positive electrode terminal 13 and the negative electrode terminal 14 are gained and an insulation voltage is improved.

The positive electrode terminal 13 and the negative electrode terminal 14 are cut-out at different corner portions to form cut-out portions, and opening portions are respectively formed at the corner portions opposite to cut-out portions. Using the opening portions, the plate-shaped conductor 16 is connected to a connection portion of a connection object (e.g., a smoothing capacitor). For example, a positive electrode side connection terminal and a negative electrode terminal, which are separated from each other so as to sandwich the plate-shaped conductor 16, are provided at the connection portion of the connection object, and cut-out portions and opening portions corresponding to the cut-out portions and the opening portions of the positive electrode terminal 13 and the negative electrode terminal 14 are provided to the respective terminals. Then, the plate-shaped conductor 16 is disposed between the positive electrode side connection terminal and the negative electrode side connection terminal, the positive electrode terminal 13 and the positive electrode side connection terminal are fixed, for example, by a screw at the opening portions, and the negative electrode terminal 14 and the negative electrode side connection terminal are fixed, for example, by a screw at the opening portions. Accordingly, the plate-shaped conductor 16 can be electrically connected to the connection portion of a component serving as the connection object.

Some of the control terminals 17 serve as signal line terminals that constitute various signal lines such as gate wirings of the semiconductor switching elements 51a-56a. For example, the control terminals 17 are electrically connected to pads connected to the gates of the semiconductor switching elements 51a-56a formed on the front surface side of the semiconductor chips 10 through bonding wires 22 (see FIG. 5C) made of, for example, Au. End portions of the control terminals 17 opposite to the semiconductor chips 10 are exposed from the resin mold part 18 so as to be connected to the outside through exposed portions. In each of the figures, the control terminals 17 are described as being integrated in a lead frame state and being integrated with the lower heat radiation plate 12. However, the control terminals 17 are divided in a final product so that the signal lines are independent from each other.

The resin mold part 18 is formed by disposing the above-described components in a molding tool and filling resin into the molding tool. The resin mold part 18 has, for example, a quadrangular plate shape. The resin mold part 18 is made of resin having an insulation property and having a linear expansion coefficient and a Young's modulus lower than conductor parts such as the upper and lower heat radiation plates 11, 12. For example, the resin mold part 18 can be mainly made of epoxy resin such as epoxy or silicone. Ends of the plate-shaped conductor 16, the control terminals 17, and the output terminals 20a-20c are exposed from sides of the quadrangular plate shape of the resin mold part 18 so as to be electrically connected to the outside. Furthermore, the upper heat radiation plate 11 and the lower heat radiation plate 12 are exposed from front and rear surfaces of the quadrangular plate shape so as to release heat favorably.

Specifically, the above-described components are mounted on the front surface side of the lower heat radiation plate 12 in the lead frame state integrated with the control terminals 17. In other words, the semiconductor chips 10, the plate-shaped conductor 16, the element relay electrodes 19, and the upper and lower arm relay electrodes 21 are mounted on the lower heat radiation plate 12. Then, after electrically connecting the semiconductor chips 10 and the control terminals 17 with bonding wires, the upper heat radiation plate 11 is mounted above them, the components are disposed in the molding tool in this state, and resin is injected into the molding tool and is molded to form the resin mold part 18. The resin mold part 18 covers the above-described components other than the surfaces of the upper and lower heat radiation plates 11, 12 and the exposed portions of the plate-shaped conductor 16, the control terminals 17, and the output terminals 20a-20c so as to protect the semiconductor chips 10 and the like.

Figure 2B:
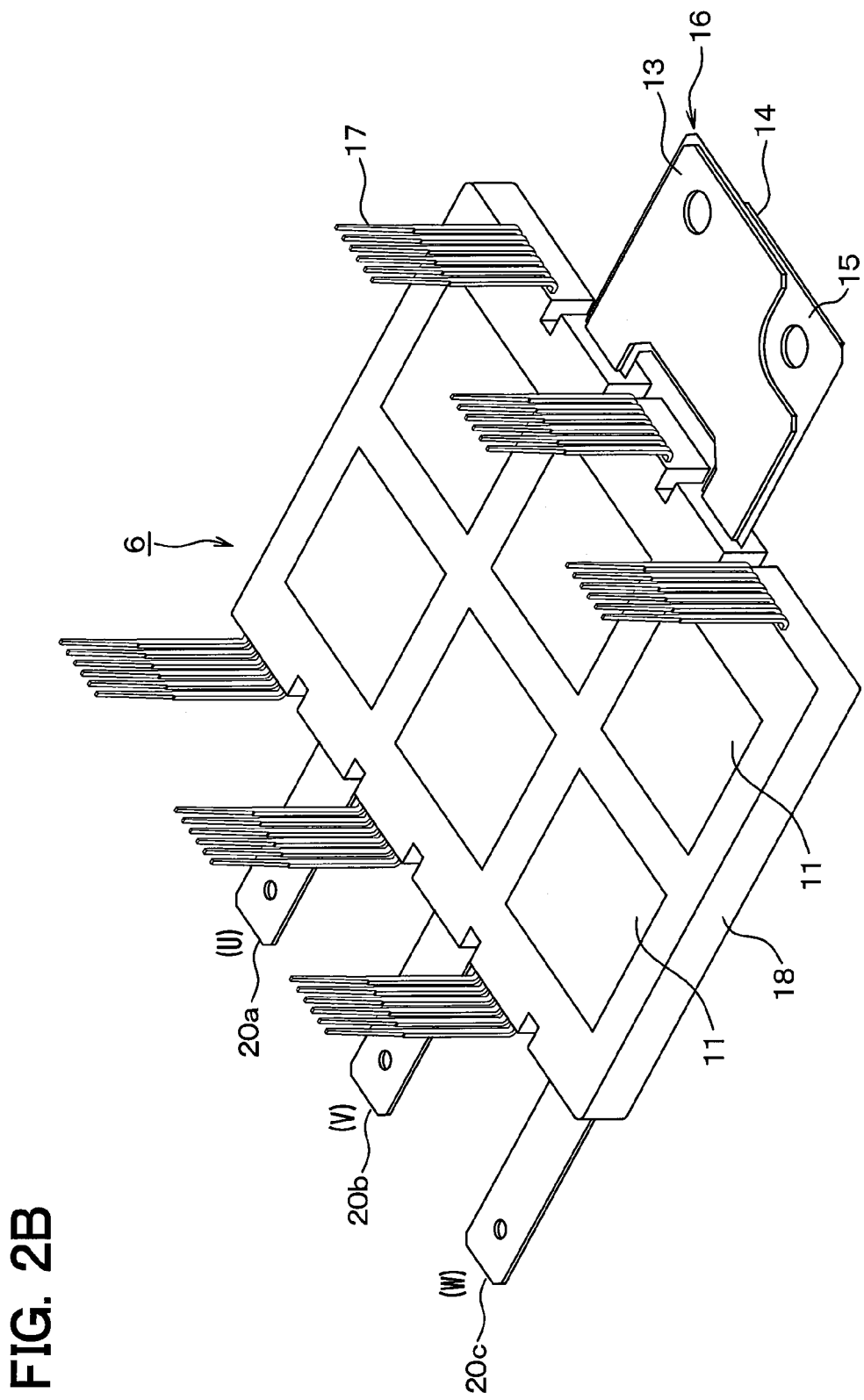
FIG. 2B is a perspective view illustrating an example of a semiconductor module.
Figure 3:
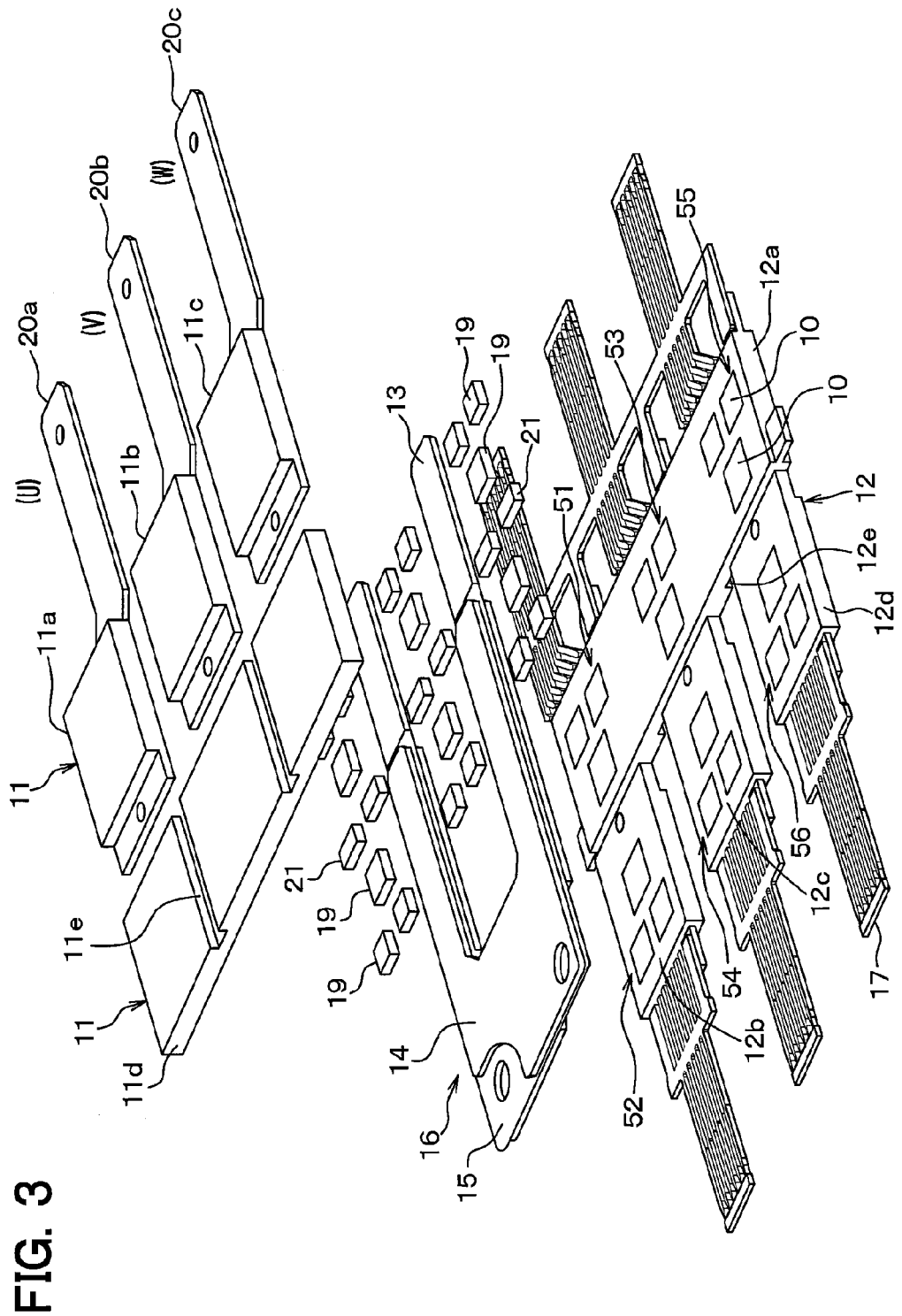
FIG. 3 is an exploded view of the semiconductor module before a resin molding.
Figure 4:
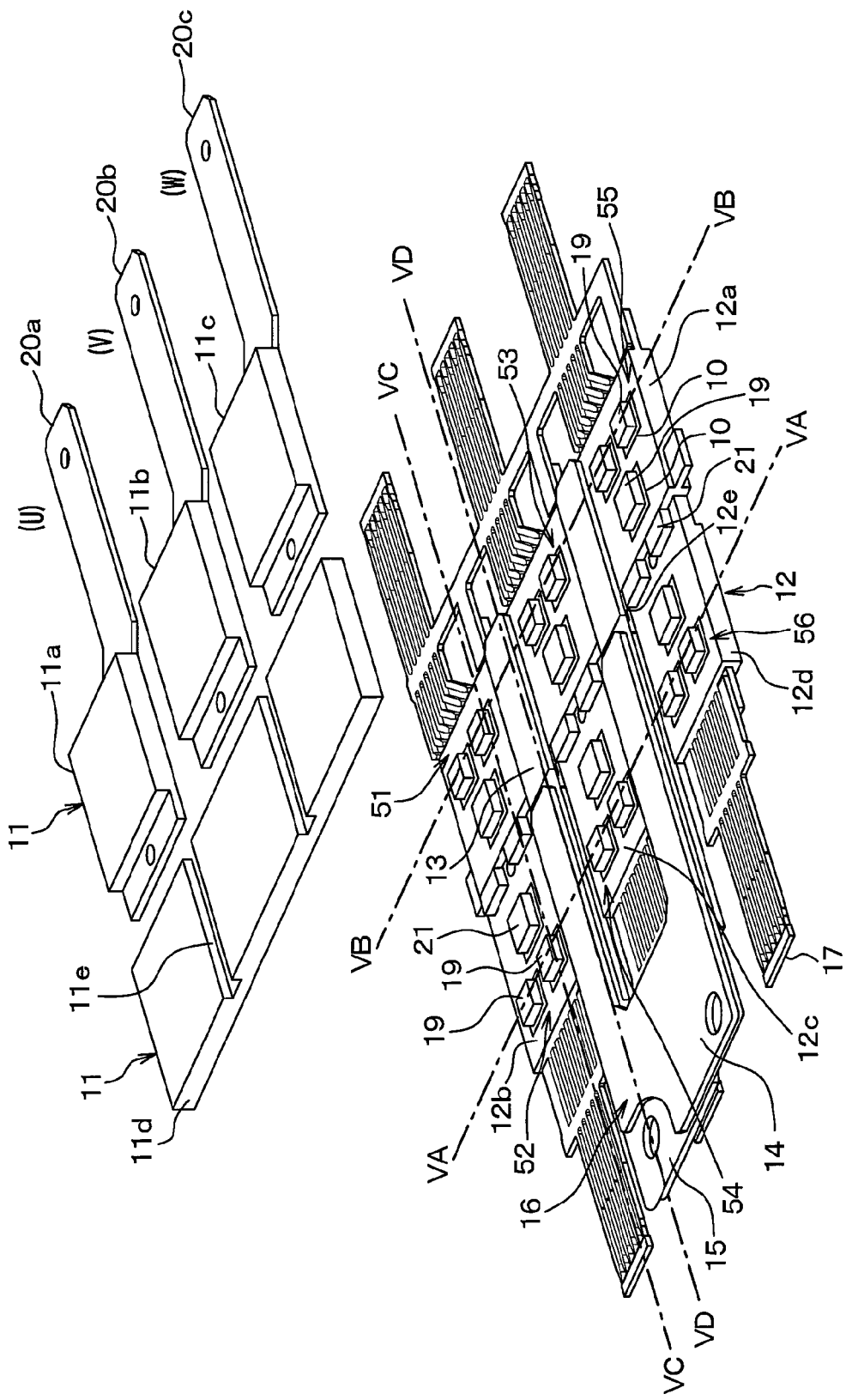
FIG. 4 is an exploded view illustrating a state where various relay electrodes are connected to semiconductor chips illustrated in FIG. 3 and upper and lower arm relay electrodes and plate-shaped conductors are connected to a lower heat radiation plate.

By the above-described structure, the semiconductor module 6 according to the present embodiment is formed. In FIG. 2A, the semiconductor module 6 in which the plate-shaped conductor 16, the control terminals 17, and the output terminals 20a-20c linearly protrude from the sides of the resin mold part 18 is described. However, this indicates only one example. As illustrated in FIG. 2B, the control terminals 17, which protrudes, may be bent in a direction perpendicular to the front surface of the resin mold 18, or as illustrated in FIG. 2C, the plate-shaped conductor 16, the control terminals 17, and the output terminals 20a-20c, which protrude, may be bent in a direction perpendicular to the front surface of the resin mold 18. In a case where only the control terminals 17 are bent, for example, the control terminals 17 may be bent to a side opposite to the plate-shaped conductor 16. In a case where the plate-shaped conductor 16, the control terminals 17, and the output terminals 20a-20c are bent, for example, a bending direction of the control terminals 17 and a bending direction of the plate-shaped conductor 16 and output terminals 20a-20c may be opposite to each other. In this way, by bending the plate-shaped conductor 16, the control terminals 17, and the output terminals 20a-20c, space saving and improvement of mountability can be achieved.

In the semiconductor module 6 configured as described above, a positive and negative electrode short-circuit loop, which is an inductance generation path, becomes a path indicated by solid arrows in FIG. 5A through FIG. 5D.

Figure 5A:
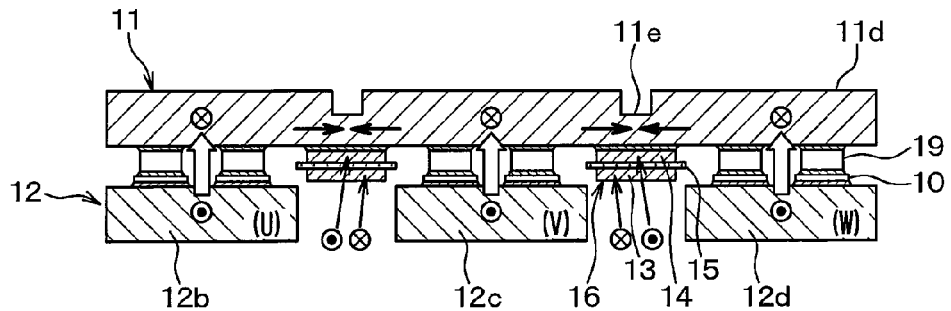
FIG. 5A is a cross-sectional view of the semiconductor module taken along line VA-VA in FIG. 4.
Figure 5B:
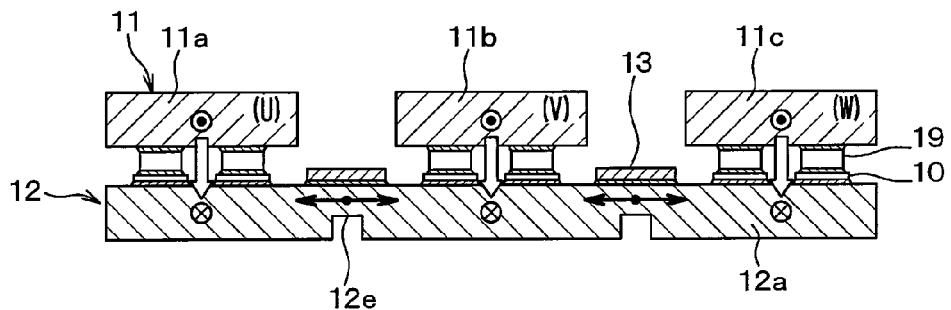
FIG. 5B is a cross-sectional view of the semiconductor module taken along line VB-VB in FIG. 4.
Figure 5C:
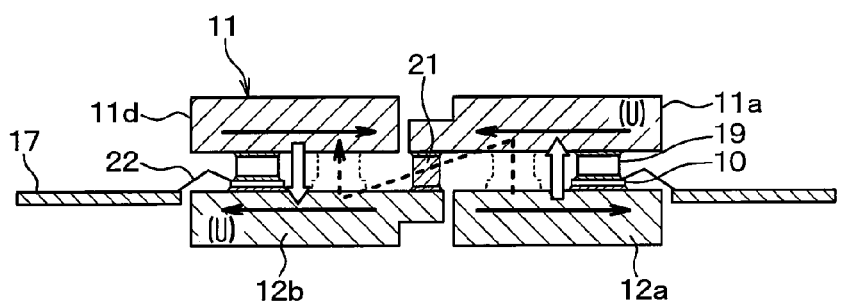
FIG. 5C is a cross-sectional view of the semiconductor module taken along line VC-VC in FIG. 4.
Figure 5D:
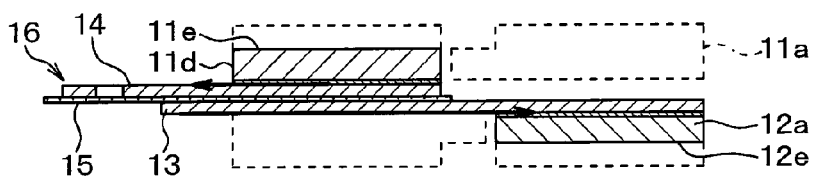
FIG. 5D is a cross-sectional view of the semiconductor module taken along line VD-VD in FIG. 4.

In other words, an electric current is supplied through the positive electrode terminal 13 as illustrated in FIG. 5D, and flows from the positive electrode terminal 13 to the lower heat radiation plate 12 as illustrated in FIG. 5B. Then, the electric current flows from the lower heat radiation plate 12a to each of the upper heat radiation plates 11a-11c through each of the semiconductor chips 10 in the upper arms 51, 53, 55. Subsequently, the electric current flows from the upper heat radiation plates 11a-11c to the lower heat radiation plates 12b-12d through the upper and lower arm relay electrodes 21 as illustrated in FIG. 5C. Furthermore, the electric current flows to the upper heat radiation plate 11d through each of the semiconductor chips 10 in the lower arms 52, 54, 56 as illustrated in FIG. 5A and FIG. 5C. Then, as illustrated in FIG. 5A and FIG. 5D, the electric current flows to the negative electrode terminal 14. The electric current flows through the above-described path. In other words, in the present embodiment, the path of the electric current from the upper arms 51, 53, 55 to the lower arms 52, 54, 56 becomes an N-shape as illustrated in FIG. 5C. It is needless to say that because the inverter circuit 1 generates a three-phase direct current in practice, all of the semiconductor switching elements 51a-56a for the three phases are not turned on at the same time. However, a dI/dt change, which is a problem in (Math. 1) flows in this direction short-cutting the positive and negative electrodes, and basically flows in the above-described path in each arm of a selected phase.

Thus, by the semiconductor module 6 according to the present embodiment, the following effects can be obtained.

Firstly, in the semiconductor module 6 according to the present embodiment, the positive electrode terminal 13 and the negative electrode terminal 14, which constitute a part of the positive electrode side wiring and the negative electrode side wiring sealed in the resin mold part 18, are formed into the plate-shaped conductor 16 formed of the parallel conductor. Then, short-circuit directions connecting the positive electrode terminal 13 and the negative electrode terminal 14 become opposite directions as illustrated in FIG. 5D. Thus, a magnetism offset can be generated in the plate-shaped conductor 16, and reduction in inductance can be achieved.

In this way, the plate-shaped conductor 16 formed of the parallel conductor enters the resin mold part 18. Thus, the area serving as the parallel conductor can be increased compared with the structure described in Patent Literature 1 in which the positive electrode input bus bar constituting the positive electrode terminal and the negative input bus bar constituting the negative electrode terminal are divided separately, and only the input terminal connected with the positive electrode input bus bar and the negative electrode input bus bar are a parallel conductor formed of a parallel conductor. Specifically, in the present embodiment, the positive electrode terminal 13 and the negative electrode terminal 14 are opposite to each other on broad planes. In contrast, in the structure in Patent Literature 1, because the positive electrode terminal and the negative electrode terminal are opposite to each other only on side surfaces, and a gap between the positive electrode terminal and the negative electrode terminal are large, a parallel conductor is less likely to be obtained. Thus, according to the structure according to the present embodiment, an area capable of generating a magnetism offset can be increased more, and further reduction in inductance can be achieved.

In addition, the upper and lower heat radiation plates 11, 12 are disposed oppositely and face each other in each of the arms 51-56. Then, as illustrated in FIG. 5A through FIG. 5C, in each of the upper and lower heat radiation plates 11, 12 disposed oppositely, the electric current flows in opposite directions. Thus, as indicated by void arrows in FIG. 5A through FIG. 5C, a magnetism offset can be generated by making the electric current flow in opposite directions in the upper and lower heat radiation plates 11, 12. Accordingly, inside the resin mold part 18, further reduction in inductance can be also achieved between the upper and lower heat radiation plates 11, 12.

As described above, in the present embodiment, an arranging direction of the upper and lower arms 51-56 of the respective phases and a lead-out direction of the positive electrode terminal 13 and the negative electrode terminal 14 correspond to each other, and a short-circuit loop in which the electric current flows in N-shape in the upper and lower arms 51-56 is formed.

In contrast, in the structure of Patent Literature 1, an arranging direction of the upper and lower arms of the respective phases and a lead-out direction of the positive electrode terminal and the negative electrode terminal are perpendicular to each other. In addition, the semiconductor chips constituting the upper and lower arms are disposed in such a manner that a vertical arrangement of positive electrode sides and negative electrode sides are opposite. Thus, after an electric current flows from the lower heat radiation plate to the upper heat radiation plate through the semiconductor chips in the upper arm, the electric current flows to the upper heat radiation plate in the lower arm and flows to the lower heat radiation plates through the semiconductor chips. Thus, a short-circuit loop in which the electric current flows in U-shape in the upper and lower arms is formed. Thus, an area capable of generating a magnetism offset is small, and reduction in induction is insufficient.

Second Embodiment

A second embodiment of the present disclosure is described. In the present embodiment, configurations of the upper and lower heat radiation plates 11, 12 are changed with respect to the first embodiment, and the other part is similar to the first embodiment. Thus, only a part different from the first embodiment is described.

Figure 7:
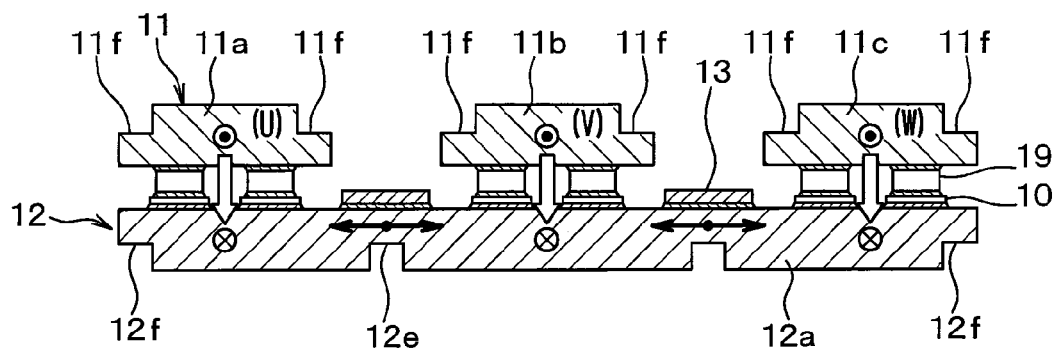
FIG. 7 is a cross-sectional view of a semiconductor module according to a second embodiment of the present disclosure.

As illustrated in FIG. 7, in the present embodiment, depressed portions 11f, 12f are formed at outer edge portions of surfaces of the upper and lower heat radiation plates 11, 12 exposed from the resin mold part 18. In a case where the depressed portions 11f, 12f are formed as described above, the resin mold part 18 also enter there, and the holding properties of the upper and lower heat radiation plates 11, 12 are enhanced. Thus, compared with the first embodiment, distortion of the upper and lower heat radiation plates 11, 12 due to thermal stress can be restricted more. Accordingly, because stress application to the semiconductor chips 10 disposed between the upper and lower heat radiation plates 11, 12 can be restricted more, detachment of the semiconductor chips 10 and the bonding material can be restricted.

Furthermore, a distance between the upper heat radiation plates 11a-11c and the upper heat radiation plate 11d, and a distance between the lower heat radiation plate 12a and the lower heat radiation plates 12b-12d be can be increased by the depressed portions 11f, 12f. Therefore, a creeping distance between them can be gained and an increase of the whole of the semiconductor module 6 for securing the creeping distance can be avoided.

In the above-described structure, the heat radiation areas of the upper and lower heat radiation plates 11, 12 are reduced. However, the heat radiation areas only need to be larger than the areas after heat diffusion in anticipation that heat transferred from the semiconductor chips 10 or the element relay electrodes 19 diffuses at the angle of 45 degrees.

Third Embodiment

A third embodiment of the present disclosure is described. In the present embodiment, a configuration of the plate-shaped conductor 16 is changed with respect to the first embodiment and the other part is similar to the first embodiment. Thus, only a part different from the first embodiment is described.

Figure 8:
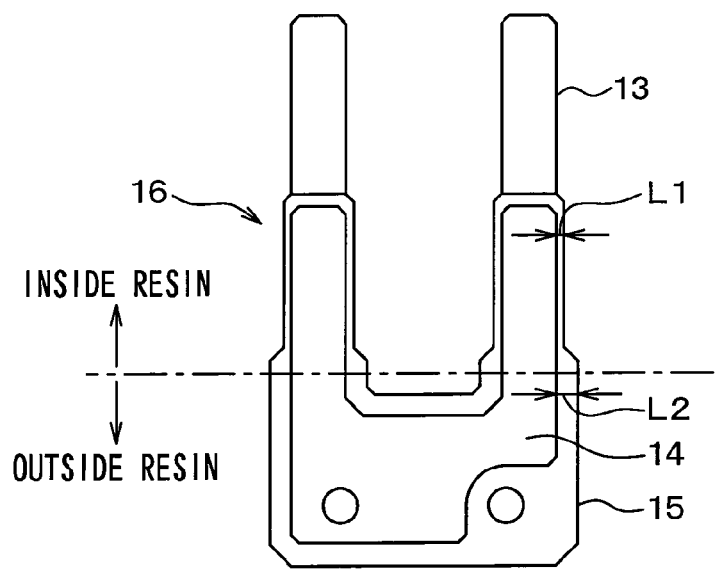
FIG. 8 is a front view of a plate-shaped conductor according to a third embodiment of the present disclosure.

As illustrated in FIG. 8, in the present embodiment, the width of the insulation film 15 in the plate-shaped conductor 16 is larger than that in the first embodiment. Specifically, compared with a width of a portion of the insulation film 15 in the plate-shaped conductor 16 embedded in the resin mold part 18, a width of a portion of the insulation film 15 exposed from the resin mold part 18 is larger. In other words, when a dimension of a region of the insulation film 15 sticking out from the positive electrode terminal 13 and the negative electrode terminal 14 in a portion of the plate-shaped conductor 16 embedded in the resin mold part 18 is indicated by L1, and a dimension of a region of the insulation film 15 sticking out from the positive electrode terminal 13 and the negative electrode terminal in a portion of the plate-shaped conductor 16 exposed from the resin mold part 18 is indicated by L2, L2 is set to be larger than L1. Accordingly, the amount of insulation film 15 sticking out from the positive electrode terminal 13 and the negative electrode terminal 14 increases, and a creeping distance between the positive electrode terminal 13 and the negative electrode terminal 14 can be gained.

Although the width of the insulation film 15 can also be increased inside the resin mold part 18, it becomes an inhibitory factor of a resin flow at resin sealing. Thus, by increasing the width only outside the resin mold part 18, a resin flow is not inhibited at resin sealing.

Fourth Embodiment

A fourth embodiment of the present disclosure is described. In the present embodiment, connection configurations of the upper and lower arms 51-56 and a connection configuration of the plate-shaped conductor 16 are changed with respect to the first embodiment, and the other part is similar to the first embodiment. Thus, only a part different from the first embodiment is described. Here, a 2-in-1 structure including only the upper and lower arms 51-52 for one phase is taken as an example. However, it is needless to say that the connection configurations can also be applied to the 6-in-1 structure described in each of the above-described embodiments.

Figure 9A:
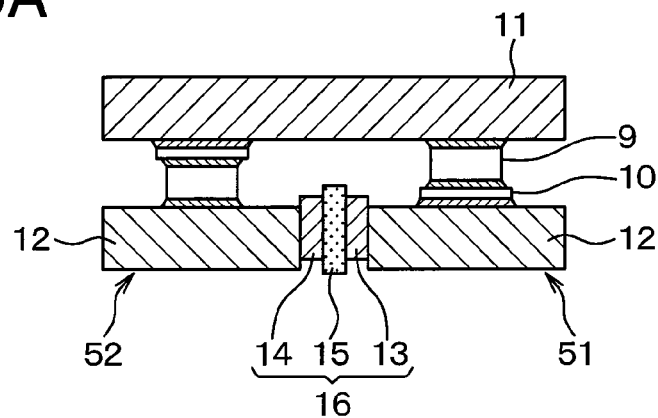
FIG. 9A is a cross-sectional view of a semiconductor module according to a fourth embodiment of the present disclosure.
Figure 9B:
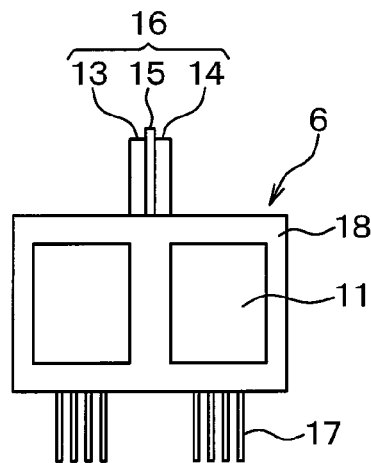
FIG. 9B is a top view of the semiconductor module illustrated in FIG. 9A.

As illustrated in FIG. 9A and FIG. 9B, in the present embodiment, vertical arrangements of the semiconductor chip 10 constituting the upper arm 51 and the semiconductor chip 10 constituting the lower arm 52 are opposite, and upper heat radiation plate 11 of the upper and lower arms 51, 52 are formed of one plate. In other words, in the upper arm 51, the positive electrode side of the semiconductor chip 10 (the rear surface electrode of the semiconductor switching element 51a and the second electrode of the rectifier 51b) is disposed toward the lower heat radiation plate 12, and the negative electrode side of the semiconductor chip 10 (the front surface electrode of the semiconductor switching element 51a and the first electrode of the rectifier 51b) is disposed toward the upper heat radiation plate 11. In the lower arm 52, the negative electrode side of the semiconductor chip 10 (the front surface electrode of the semiconductor switching element 52a and the first electrode of the rectifier 52b) is disposed toward the lower heat radiation plate 12, and the positive electrode side of the semiconductor chip (the rear surface electrode of the semiconductor switching element 52a and the second electrode of the rectifier 52b) is disposed toward the upper heat radiation plate 11. In addition, at a position between both side surfaces of the lower heat radiation plate 12 of the upper arm 51 and the lower heat radiation plate 12 of the lower arm 52, the plate-shaped conductor 16 is disposed in such a manner that the thickness direction of the plate-shaped conductor 16 corresponds to the normal direction of the both side surfaces. Then, the side surface of the lower heat radiation plate 12 of the upper arm 51 and the positive electrode terminal 13 are connected, and the side surface of the lower heat radiation plate 12 of the lower arm 52 and the negative electrode terminal 14 are connected.

In the above-described configuration, a short-circuit loop is formed in such a manner that an electric current flows in a U-shape in the upper and lower arms 51, 52. Thus, although an area capable of generating a magnetism offset is smaller than the first embodiment, in which the components are disposed in such a manner an electric current flows in an N-shape, because the plate-shaped conductor 16 enters inside of the resin mold part 18, reduction in inductance can be achieved.

Modification of Fourth Embodiment

Figure 10:
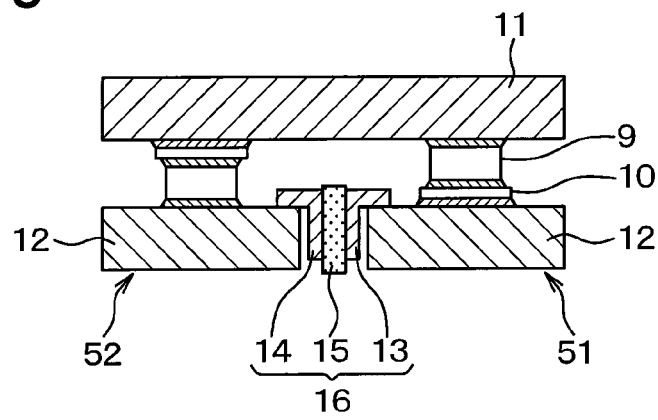
FIG. 10 is a cross-sectional view of a semiconductor module according to a modification of the fourth embodiment.

In the fourth embodiment, the shape of the plate-shaped conductor 16 can be optionally changed. For example, in the positive electrode terminal 13 and the negative electrode terminal 14 constituting the plate-shaped conductor 16 serving as the lead-out conductor, a structure in which facing surfaces have a parallel relationship and opposite surfaces do not have a parallel relationship may also be employed. Specifically, as illustrated in FIG. 10, upper positions of the positive electrode terminal 13 and the negative electrode terminal 14 may overhang so as to be hooked to the front surface of the lower heat radiation plate 12.

Figure 11A:
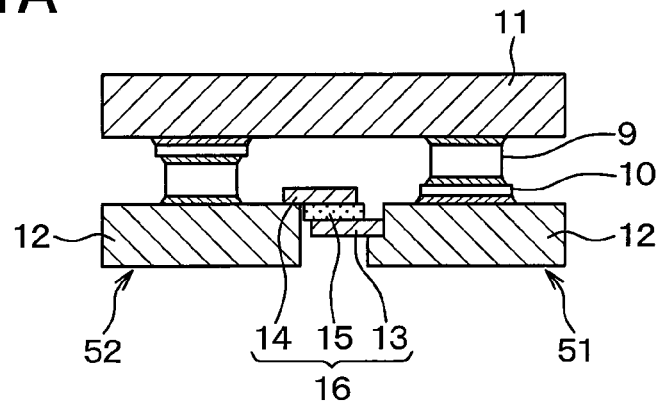
FIG. 11A is a cross-sectional view of a semiconductor module according to a modification of the fourth embodiment.
Figure 11B:
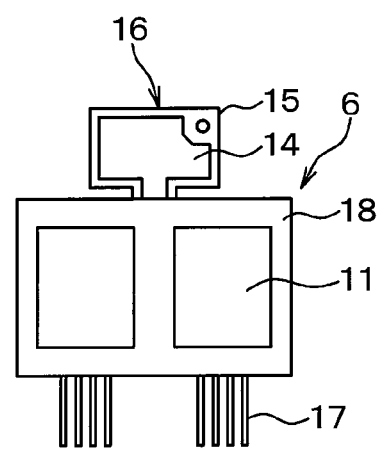
FIG. 11B is a top view of the semiconductor module illustrated in FIG. 11A.

The thickness direction of the plate-shaped conductor 16 does not need to correspond to the normal direction of the both side surfaces of the lower heat radiation plate 12. For example, as illustrated in FIG. 12A, a plane of the plate-shaped conductor 16 and the front surface of the lower heat radiation plate 12 are disposed in parallel, and the lower heat radiation plate 12 on the upper arm 51 side is formed into a stepped shape. In addition, the positive electrode terminal 13 and the negative electrode terminal 14 are disposed to be shifted while forming facing surfaces, and shifted portions stick out from the insulation film 15. Then, the positive electrode terminal 13 is disposed on the stepped portion of the lower heat radiation plate 12 of the upper arm 51, and the negative electrode terminal 14 is disposed on the front surface of the lower heat radiation plate 12. The above-described structure can be also employed. In the above-described structure, as illustrated in FIG. 11B, the portion of the plate-shaped conductor 16 exposed from the resin mold part 18 may have a structure similar to that of the first embodiment.

Furthermore, although a case where the lead-out conductor part is formed of the plate-shaped conductor 16 has been described, the lead-out conductor part does not need to have a plate shape, and the lead-out conductor part may have a block shape having a larger thickness.

Fifth Embodiment

A fifth embodiment of the present disclosure is described. In the present embodiment, a configuration of the plate-shaped conductor 16 is changed with respect to the first through fourth embodiments, and the other part is similar to the first through fourth embodiments. Thus, only a part different from the first through fourth embodiments is described. Although the following is described as a modification to the first through third embodiments, the fourth embodiment may be modified similarly.

Figure 12:
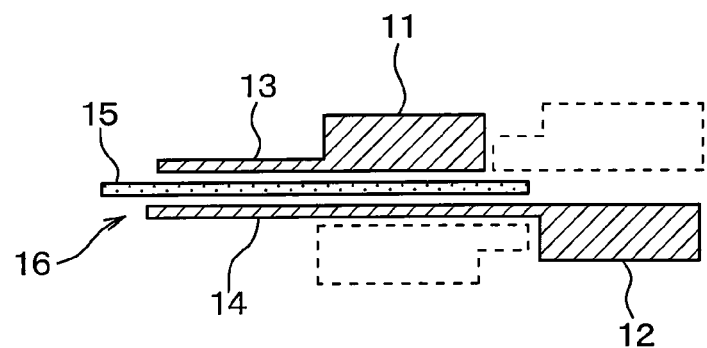
FIG. 12 is a cross-sectional view illustrating a positive electrode terminal, a negative electrode terminal, and heat radiation plates included in a semiconductor module according to a fifth embodiment of the present disclosure.

As illustrated in FIG. 12, the positive electrode terminal 13 constituting the plate-shaped conductor 16 can be formed of a part of the upper heat radiation plate 11, and the negative electrode terminal 14 constituting the plate-shaped conductor 16 can be formed of a part of the lower heat radiation plate 12. In other words, the positive electrode terminal 13 and the negative electrode terminal 14 may be connected to the upper or lower heat radiation plate 11, 12 in a lead frame state so as to be led out from them. When the components sealed by the resin mold part 18 are mounted, the insulation film 15 is disposed between the positive electrode terminal 13 and the negative electrode terminal 14 in the lead frame state, and the positive electrode terminal 13 and the negative electrode terminal 14 are bonded. In addition, by forming the resin mold part 18 in a state where a gap between the positive electrode terminal 13 and the negative electrode terminal 14 is kept constant, the resin mold part 18 is filled in the gap, and the insulation film 15 may be substituted by the resin mold part 18 filled in the gap. In this case, the number of components can be reduced.

Sixth Embodiment

A sixth embodiment of the present disclosure is described. Also in the present embodiment, as an application example of a semiconductor device according to an embodiment of the present disclosure, a semiconductor module including a three-phase inverter that drives, for example, a three-phase alternating current motor is described.

Figure 22:
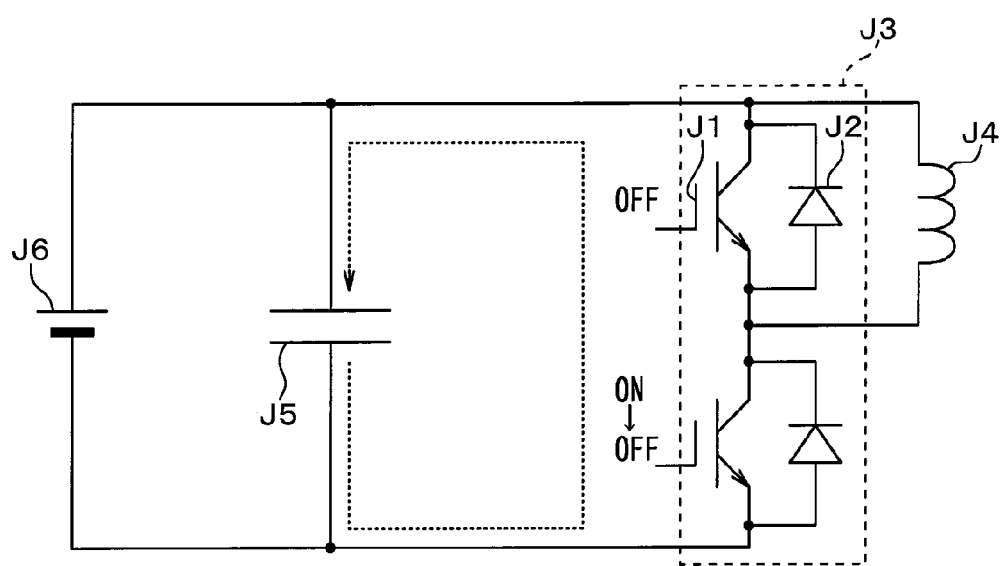
FIG. 22 is a simple model diagram of a circuit to which a bridge circuit formed of a semiconductor module is applied.
Figure 23:
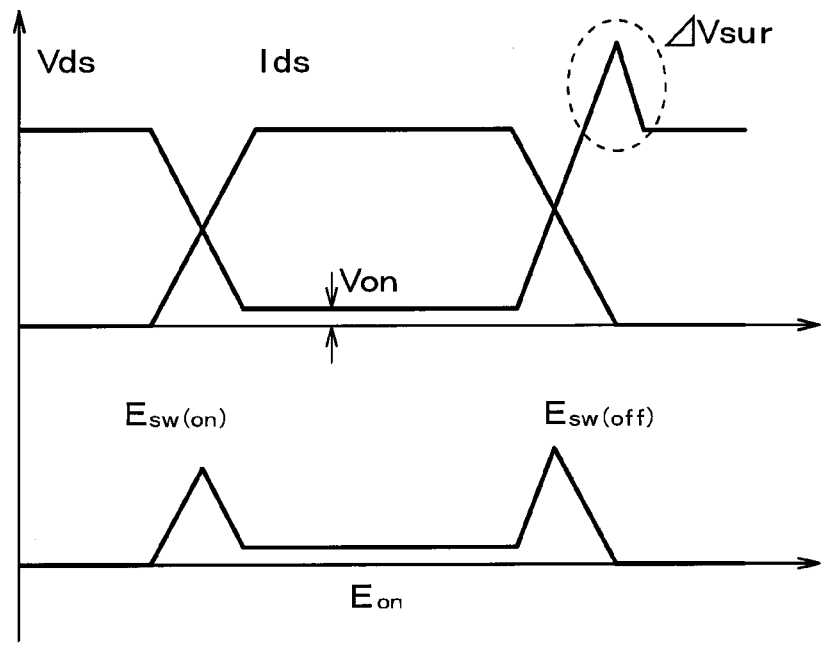
FIG. 23 is a timing diagram illustrating a state where a semiconductor switching element in the bridge circuit is switched.
Figure 24:
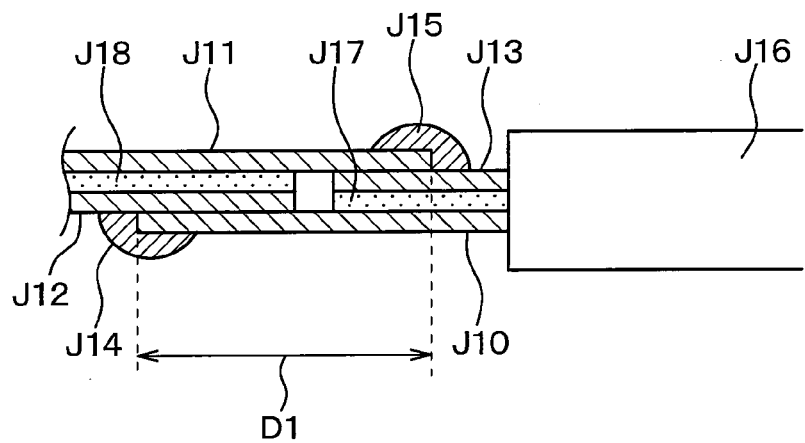
FIG. 24 is a cross-sectional view illustrating a connection structure according to the prior art.

The three phase inverter is used for alternating current driving a load, for example, a three-phase alternating current motor, based on a direct current power source. The three phase inverter includes bridge circuits for three phases of a U-phase, a V-phase, and a W-phase, and each of the bridge circuits has a configuration similar to the bridge circuit J3 having the upper and the lower arm, which is illustrated in FIG. 22. The semiconductor module according to the present embodiment is integrated by sealing various circuit components and circuit wirings constituting the bridge circuits for the three phases with resin.

Figure 13:
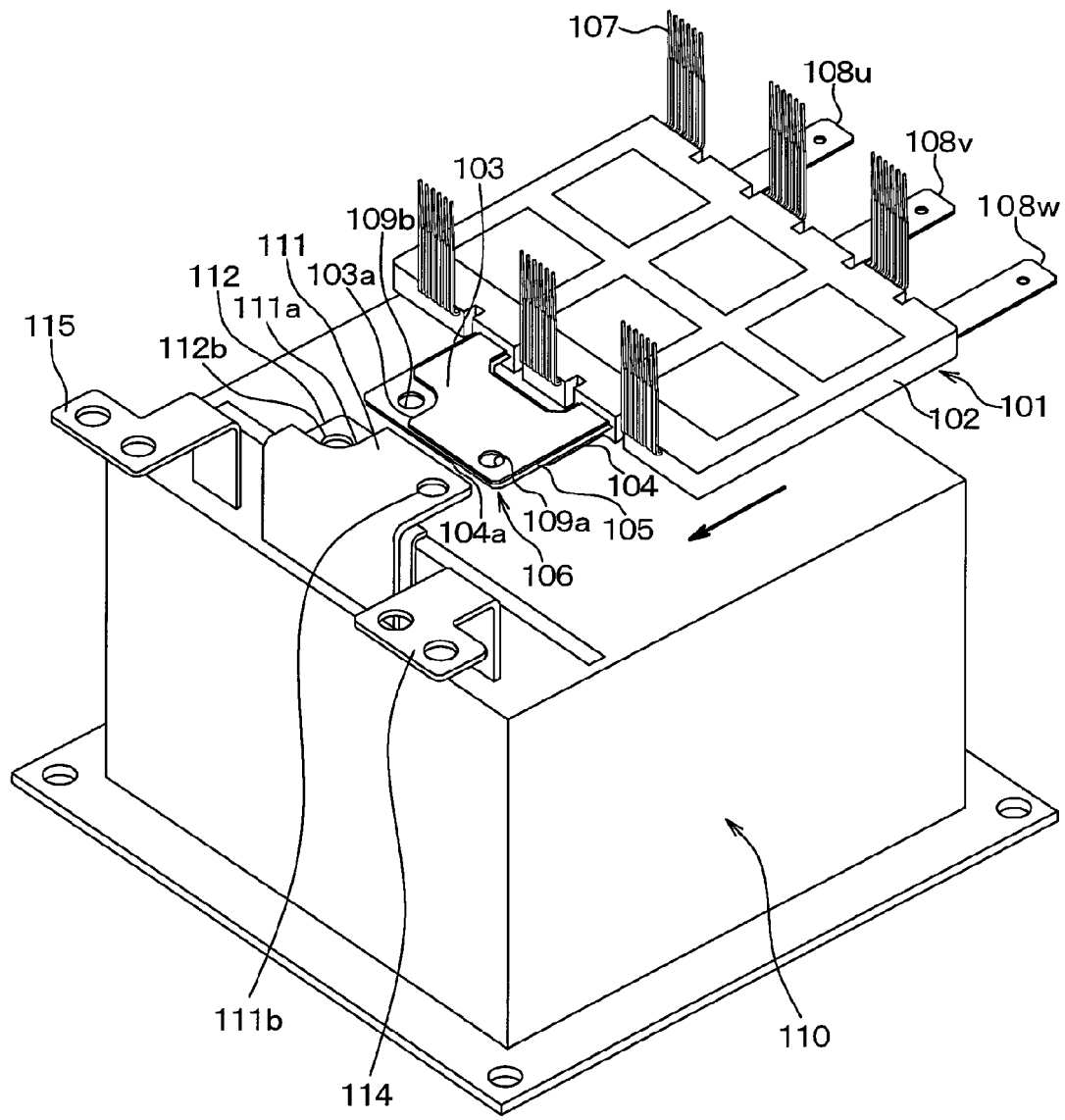
FIG. 13 is a perspective view illustrating a state before connecting a semiconductor module and a smoothing capacitor according to a sixth embodiment of the present disclosure.

As illustrated in FIG. 13, a semiconductor module 101 is integrally formed by sealing various circuit components and circuit wirings constituting a three-phase inverter with a resin 102. The resin 102 has a substantially quadrangular plate shape. A positive electrode terminal 103 and a negative electrode terminal 104 of the bridge circuit serving as a part of the circuit wirings are provided so as to protrude from a side of the substantially quadrangular plate shape.

The positive electrode terminal 103 and the negative electrode terminal 104 are bonded to each other while sandwiching an insulation film 105 having a thin plate shape. The positive electrode terminal 103, the negative electrode terminal 104, and the insulation film 105 are integrated to provide one plate-shaped conductor 106, that is, a parallel conductor in which the positive electrode terminal 103 and the negative electrode terminal 104 are disposed in parallel. The positive electrode terminal 103 and the negative electrode terminal 104 of the semiconductor module 101 configured as described above are respectively connected with a positive electrode side connection terminal 111 and a negative electrode side connection terminal 112 of a smoothing capacitor 110 so that the smoothing capacitor 110 is connected in parallel with each of the bridge circuits.

The semiconductor module 101 includes control terminals 107 connected to gate electrodes of semiconductor switching elements included in the bridge circuits, and output terminals 108$u$, 108$v$, 108$w$ connecting positions between the upper arm and the lower arms of the respective phases and the three-phase alternating current motor serving as the load. The control terminals 107 and the output terminals 108$u$, 108$v$, 108$w$ are exposed from the resin 102 so as to be electrically connected to an external circuit or the load such as the three-phase alternating current motor at outside of the resin 102.

Specifically, a connection structure of the semiconductor module 101 and the smoothing capacitor 110 is as follows. The connection structure is described with reference to FIG. 14 through FIG. 17. Although FIG. 14 is not a cross-sectional view, FIG. 14 is partially indicated by hatching to make the connection structure of the semiconductor module 101 and the smoothing capacitor 110 easy to see.

Firstly, with reference to FIG. 13, FIG. 14, and FIG. 15A through FIG. 15C, a detailed structure of a connection portion of the semiconductor module 101, that is, detailed structures of the positive electrode terminal 103, the negative electrode terminal 104, and the insulation film 105 are described.

The connection portion of the semiconductor module 101 is formed of the plate-shaped conductor 106 constituted of the positive electrode terminal 103, the negative electrode terminal 104, and the insulation film 105. By connecting the plate-shaped conductor 106 to a connection portion of the smoothing capacitor 110, the connection structure of the semiconductor module 101 and the smoothing capacitor 110 is formed. Hereafter, a direction in which the plate-shaped conductor 106 protrudes of the resin 102 is defined as a protruding direction, and a direction perpendicular to the protruding direction is defined as a width direction.

Figure 14:
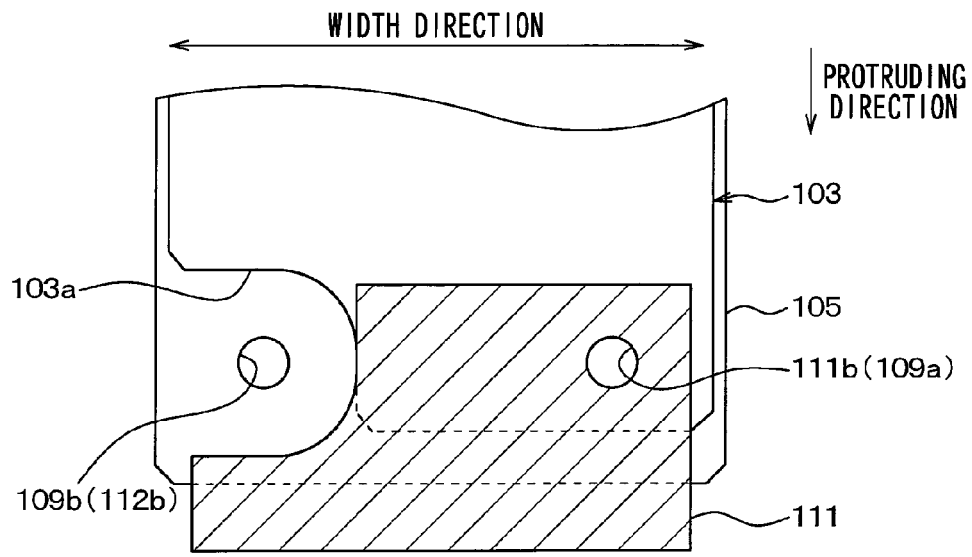
FIG. 14 is a top layout diagram illustrating a connection structure of the semiconductor module and the smoothing capacitor.
Figure 15A:
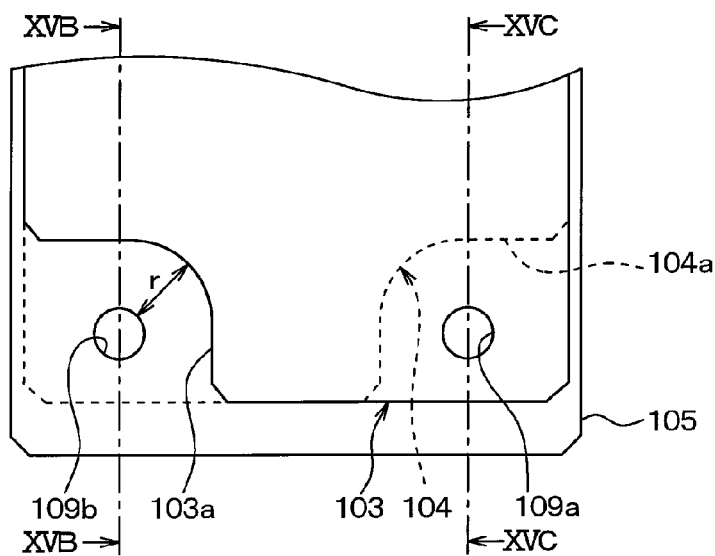
FIG. 15A is a top view of the connection structure of the semiconductor module.
Figure 15B:
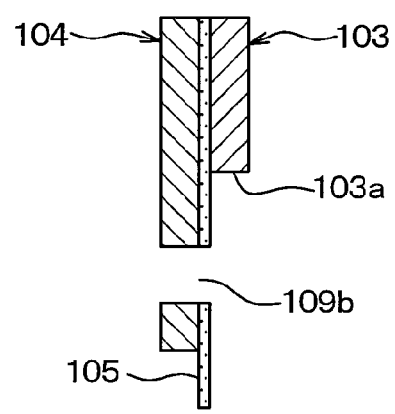
FIG. 15B is a cross-sectional view of the semiconductor module taken along line XVB-XVB in FIG. 15A.
Figure 15C:
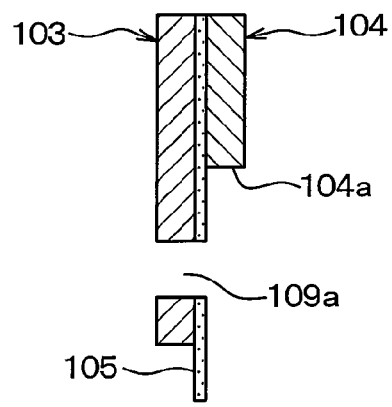
FIG. 15C is a cross-sectional view of the semiconductor module taken along line XVC-XVC in FIG. 15A.

As illustrated in FIG. 13 and FIG. 14, the insulation film 105 is a size larger than the positive electrode terminal 103 and the negative electrode terminal 104 in the protruding direction and the width direction, and outer edge portions of the positive electrode terminal 103 and the negative electrode terminal 104 are located inside an outer edge portion of the insulation film 105. At a portion exposed outside the resin 102, an external shape of the insulation film 105 has a substantially quadrangular shape. The positive electrode terminal 103 and the negative electrode terminal 104 have substantially the same width as the insulation film 105 on a side closer to the resin 102. However, as illustrated in FIG. 15A through FIG. 15C, on a side away from resin 102, corner portions of one side are formed as cut-out portions 103$a$, 104$a$ so that the positive electrode terminal 103 and the negative electrode terminal 104 are narrower than the insulation film 105. The cut-out portions 103$a$, 104$a$ of the positive electrode terminal 103 and the negative electrode terminal 104 are formed at different corner portions at a leading edge of the plate-shaped conductor 106. In the width direction, distances from a side of the resin 102 from which the plate-shaped conductor 106 protrudes to the cut-out portions 103a, 104a are substantially equal to each other.

At portions of the positive electrode terminal 103 and the insulation film 105 corresponding to the cut-out portion 104a, an opening portion (a first opening portion) 109a is formed. At portions of the negative electrode terminal 104 and the insulation film 105 corresponding to the cut-out portion 103a, an opening portion (a second opening portion) 109b is formed. Although the opening portions 109a, 109b may have any shapes, in the present embodiment, the opening portions 109a, 109b have circular shapes. In addition, although the cut-out portions 103a, 104b may have any cut-out shapes, in the present embodiment, the cut-out portions 103a, 104a have arc shapes respectively centered on the opening portions 109a, 109b so as to be away from the opening portions 109a, 109b by a predetermined distance r or more. Thus, a straight line connecting the opening portions 109a, 109b disposed at center portions of the cut-out portions 103a, 104a having the arc shapes is parallel to the side of the resin 102 from which the plate-shaped conductor 106 protrudes, and distances from the side to the opening portions 109a, 109b are substantially equal to each other.

Figure 16A:
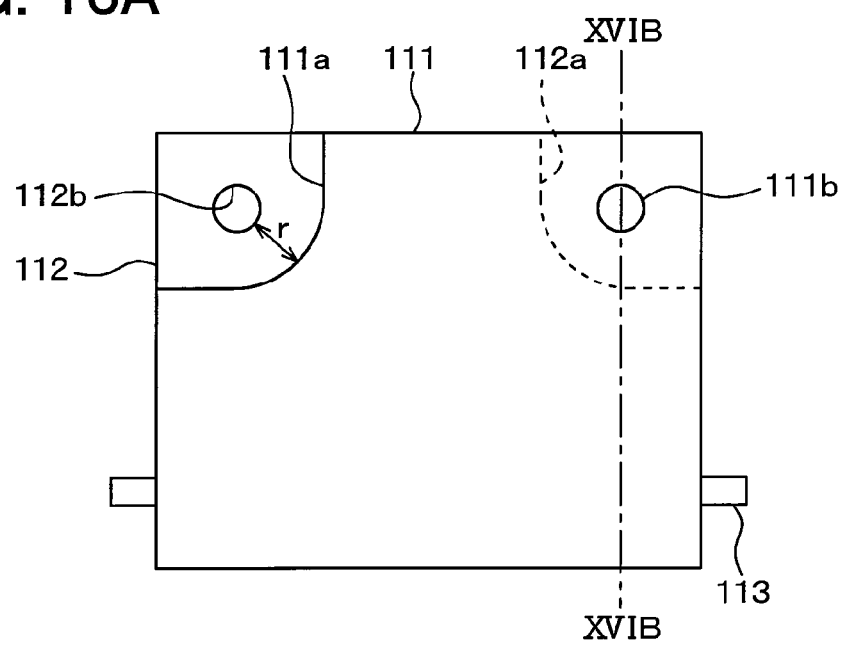
FIG. 16A is an enlarged top view of a connection portion of the smoothing capacitor.
Figure 16B:
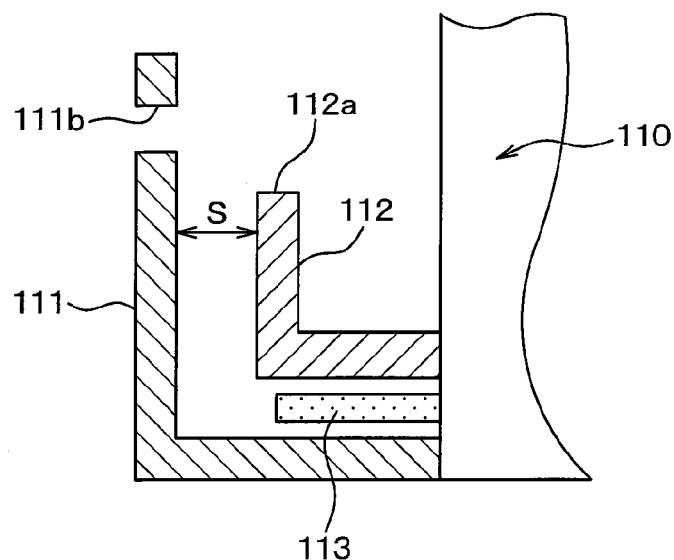
FIG. 16B is a cross-sectional view of the connection portion of the smoothing capacitor taken along line XVIB-XVIB in FIG. 16A.

Next, with reference to FIG. 13, FIG. 16A, and FIG. 16B, a detailed structure of the connection portion of the smoothing capacitor 110, that is, detailed structures of the positive electrode side connection terminal 111 and the negative electrode side connection terminal 112 are described.

In addition to the positive electrode side connection terminal 111 and the negative electrode side connection terminal 112, the connection portion of the smoothing capacitor 110 has a structure including an insulation portion 113 disposed between the positive electrode side connection terminal 111 and the negative electrode side connection terminal 112 as illustrated in FIG. 16A and FIG. 16B. In the present embodiment, as illustrated in FIG. 13 and FIG. 16B, the positive electrode side connection terminal 111 and the negative electrode side connection terminal 112 are extended in a perpendicular direction from a surface of a body of the smoothing capacitor 110. Leading edge portions of the positive electrode side connection terminal 111 and the negative electrode side connection terminal 112 are bent in a perpendicular direction at positions away from the surface of the body. Due to the above-described bent structure, upper and lower surfaces of the semiconductor module 101 can be sandwiched by a cooling device (not shown), and a unit can be made compact.

The positive electrode side connection terminal 111 and the negative electrode side connection terminal 112 are disposed in parallel both at portions closer to the leading edge portions than the bent portion and at portions closer to the smoothing capacitor 110. The positive electrode side connection terminal 111 and the negative electrode side connection terminal 112 also constitute a parallel conductor. At the bent leading edge portions, the positive electrode side connection terminal 111 and the negative electrode side connection terminal 112 have shapes corresponding to the connection portion of the semiconductor module 101.

Specifically, as illustrated in FIG. 16A, at the leading edge portions of the connection portions in the vicinity of the bent portions, the positive electrode side connection terminal 111 and the negative electrode side connection terminal 112 have the same width (width in a left and right direction in the figure). In addition, at positions closer to the leading edges, the positive electrode side connection terminal 111 and the negative electrode side terminal 112 have cut-out portions 111a, 112a at corner portions on one side. The cut-out portions 111a, 112a are formed at different corner portions of the leading edges of the connection portions. In the same direction as the protruding direction, distances from the bent portions to the cut-out portions 111a, 112a are substantially equal to each other. More specifically, the cut-out portions 111a, 112a are respectively formed at positions corresponding to the cut-out portions 103a, 104a of the positive electrode terminal 103 and the negative electrode terminal 104 included in the semiconductor module 101. Thus, as described later, when the semiconductor module 101 and the smoothing capacitor 110 are connected, the cut-out portion 103a of the positive electrode terminal 103 matches with the cut-out portion 111a of the positive electrode side connection terminal 111, and the cut-out portion 104a of the negative electrode terminal 104 matches with the cut-out portion 112a of the negative electrode side connection terminal 112. In addition, the corner portion of the positive electrode terminal 103 opposite to the cut-out portion 103a matches with the corner portion of the positive electrode side connection terminal 111 opposite to the cut-out portion 111a, and the corner portion of the negative electrode terminal 104 opposite to the cut-out portion 104a matches with the corner portion of the negative electrode side connection terminal 112 opposite to the cut-out portion 112a.

At a portion of the positive electrode side connection terminal 111 corresponding to the cut-out portion 112a, an opening portion (a third opening portion) 111b is formed. At a portion of the negative electrode side connection terminal 112 corresponding to the cut-out portion 111a, an opening portion (a fourth opening portion) 112b is formed. Although the opening portions 111b, 112b may have any shapes, in the present embodiment, the opening portions 109a, 109b have circular shapes. In addition, although the cut-out portions 103a, 104b may have any cut-out shapes, in the present embodiment, the cut-out portions 111a, 112a have arc shapes respectively centered on the opening portions 111b, 112b so as to be away from the opening portions 111b, 112b by a predetermined distance r or more. Thus, a straight line connecting the opening portions 111b, 112b disposed at center portions of the cut-out portions 111a, 112a having the arc shapes is parallel to a side constituted of the bent portions, and distances from the side to the opening portions 111b, 112b are substantially equal to each other.

Thus, as described later, when the semiconductor module 101 and the smoothing capacitor 110 are connected, as illustrated in FIG. 14, the opening portions 111b matches with the opening portion 109a of the semiconductor module 101, and the opening portion 112b matches with the opening portion 109b of the semiconductor module 101.

The insulation portion 113 is extended in the perpendicular direction from the surface of the body of the smoothing capacitor 110 and is disposed between the positive electrode side connection terminal 111 and the negative electrode side connection terminal 112 to insulate them. Although the insulation portion 113 may be formed to be in contact with the positive electrode side connection terminal 111 and the negative electrode side connection terminal 112, in the present embodiment, the insulation portion 113 is disposed away from the positive electrode side connection terminal 111 and the negative electrode side connection terminal 112. By disposing the insulation portion 113 away from the positive electrode side connection terminal 111 and the negative electrode side connection terminal 112, a creeping distance between the positive electrode side connection terminal 111 and the negative electrode side connection terminal 112 can be increased.

Although the insulation portion 113 may have any width (a width in a right and left direction in FIG. 16A), the width of the insulation portion 113 is set to be wider than the positive electrode side connection terminal 111 and the negative electrode side connection terminal 112 in order to gain a creeping distance on both sides in the width direction of the positive electrode side connection terminal 111 and the negative electrode side connection terminal 112. Thus, both ends in the width direction of the insulation portion 113 protrude more than the both ends in the width direction of the positive electrode side connection terminal 111 and the negative electrode side connection terminal 112. Moreover, although the insulation portion 113 may have any protruding amount from the surface of the smoothing capacitor 110, it is preferable that the protruding mount is ½ or more of a creeping distance required between the positive electrode side connection terminal 111 and the negative electrode side connection terminal 112. Accordingly, the required creeping distance can be satisfied only by the insulation portion 113. However, it is preferable that the protruding amount is reduced so as to prevent an interference with the insulation portion 113 when the plate-shaped conductor 106 is disposed between the positive electrode side connection terminal 111 and the negative electrode side connection terminal 112.

The positive electrode side connection terminal 111, the negative electrode side connection terminal 112, and the insulation portion 113 may have any thicknesses. However, at least at the connection portion, a distance S between facing surfaces of the positive electrode side connection terminal 111 and the negative electrode side connection terminal 112 is greater than the thickness of the plate-shaped conductor 106, that is, the sum of the thicknesses of the positive electrode terminal 103, the negative electrode terminal 104, and the insulation film 105. The smoothing capacitor 110 further includes a power source connection positive electrode terminal 114 and a power source connection negative electrode terminal 115 and is connected to a direct current power source through the terminals 114, 115.

When the semiconductor module 101 and the smoothing capacitor 110 are connected using the above-described connection portions, for example, a connection structure illustrated in FIG. 17 is formed. Although the following describes a case where a screw mechanism including bolts 120, 122 and nuts 121, 123 is used for connection in the connection structure, the connection does not need to be the screw mechanism. For example, a connection by brazing or welding may also be employed. The opening portions 109a, 109b, 111b, 112b are used for positioning when conductor parts are connected and are formed into the circular shapes in view of using the screw mechanism. However, in a case where brazing or welding is employed, opening portions may have shapes other than circular shapes and the number of opening portions may be multiple. It is needless to say that even in a case where a screw mechanism is employed, shapes of opening portions are not limited to circular shapes as long as connection by the screw mechanism can be performed.

The connection portion of the semiconductor module 101 is fitted into the connection portion of the smoothing capacitor 110 from a direction illustrated by an arrow in FIG. 13 and a connection performed with the screw mechanism. Accordingly, the connection structure illustrated in FIG. 17 can be obtained.

Figure 17A:
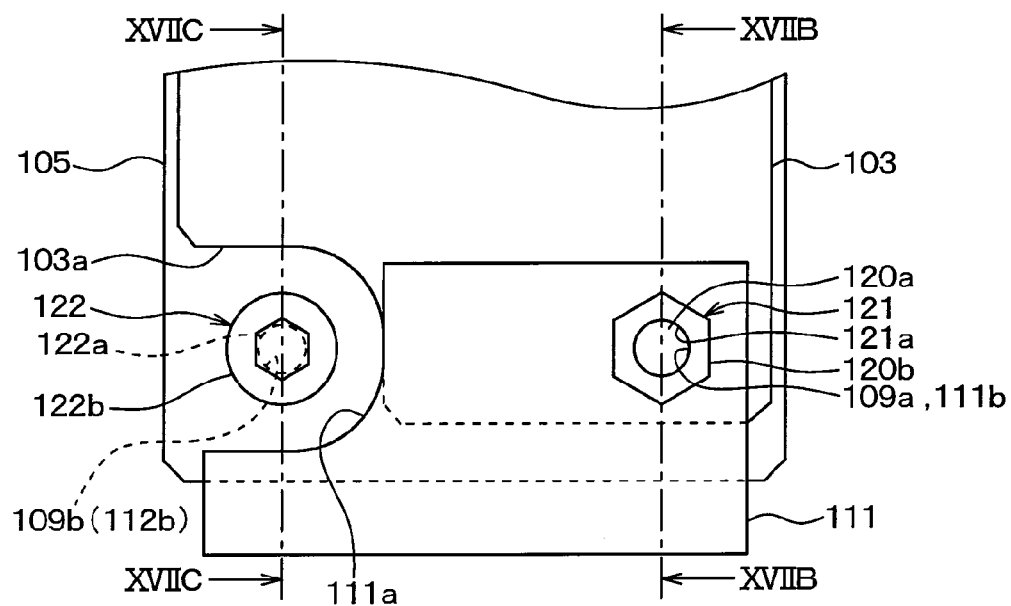
FIG. 17A is a top view of the connection structure of the semiconductor module and the smoothing capacitor.
Figure 17B:
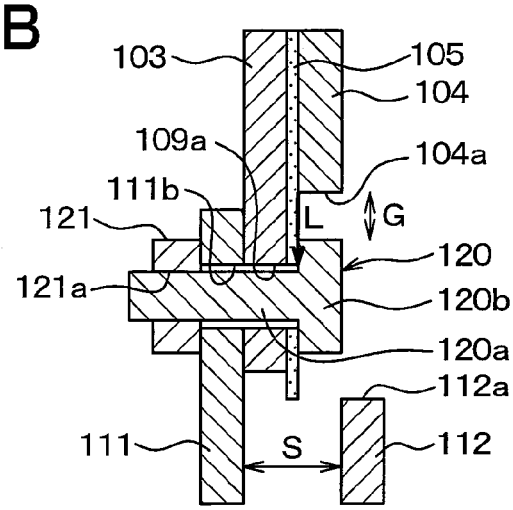
FIG. 17B is a cross-sectional view of the connection structure of the semiconductor module and the smoothing capacitor taken along line XVIIB-XVIIB in FIG. 17A.
Figure 17C:
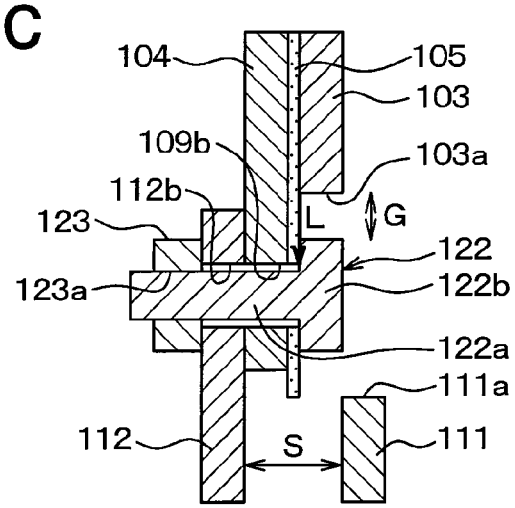
FIG. 17C is a cross-sectional view of the connection structure of the semiconductor module and the smoothing capacitor taken along line XVIIC-XVIIC in FIG. 17A.

In other words, the plate-shaped conductor 106 is sandwiched between the positive electrode side connection terminal 111 and the negative electrode side connection terminal 112 so that the positive electrode terminal 103 comes into contact with the positive electrode side connection terminal 111, and the negative electrode terminal 104 comes into contact with the negative electrode side connection terminal 112. Accordingly, the cut-out portion 103a matches with the cut-out portion 111a, and the cut-out portion 104a matches with the cut-out portion 112a. In addition, the opening portion 109a matches with the opening portion 111b, and the opening portion 109b matches with the opening portion 112b. Then, as illustrated in FIG. 17A and FIG. 17B, after a male screw portion 120a of the bolt 120 is inserted into the opening portions 109a, 111b, the male screw portion 120a is screwed into a female screw portion 121a of the nut 121 on a side opposite to a screw head 120b to fasten in a state where the insulation film 105, the positive electrode terminal 103, and the positive electrode side connection terminal 111 are sandwiched. In addition, as illustrated in FIG. 17A and FIG. 17C, after a male screw portion 122a of the bolt 122 is inserted into the opening portions 109b, 112b, the male screw portion 122a is screwed into a female screw portion 123a of the nut 123 on a side opposite to a screw head 122b to fasten in a state where the insulation film 105, the negative electrode terminal 104, and the negative electrode side connection terminal 112 are sandwiched. Accordingly, the connection structure is realized in such a manner that the positive electrode terminal 103 and the positive electrode side connection terminal 111 are sandwiched by a first screw mechanism constituted of the bolt 120 and the nut 121 and are electrically connected to each other, and the negative electrode terminal 104 and the negative electrode side connection terminal 112 are sandwiched by a second screw mechanism constituted of the bolt 122 and the nut 123 and are electrically connected to each other.

The bolts 120, 122 and the nuts 121, 123 may have any positional relationship. In other words, the screw heads 120b, 122b and the nuts 121, 123 may be disposed on any surfaces sandwiching the plate-shaped conductor 106 and the positive electrode side connection terminal 111 or the negative electrode side connection terminal 112, and may be disposed at positions opposite to the positions illustrated in FIG. 17A through FIG. 17C. In other words, on the premise that the creeping distance is secured, the bolts 120, 122 and the nuts 121, 123 may be located at either side.

The bolts 120, 122 and the nuts 121, 123 may be made of conductive material or insulating material. In a case where the bolts 120, 122 and the nuts 121, 123 are made of conductive material, specifically, metal, a fastening force can be increased more.

In a case where the bolts 120, 122 and the nuts 121, 123 are made of insulating material, a shortest distance L between a portion being a positive electrode potential and a portion being a negative electrode potential through the opening portions 109a, 109b is between portions of the cut-out portion 103a and the negative electrode terminal 104 exposed from the opening portion 109b and portions of the cut-out portion 104a and the positive electrode terminal 103 exposed from the opening portion 109a. The shortest distance L only needs to be longer than a length required as the creeping distance.

In a case where the bolts 120, 122 and the nuts 121, 123 are made of conductive material, because these become the positive electrode potential or the negative electrode potential, these relate to the creeping distance. However, the cut-out portions 103a, 104a, 111a, 112a are respectively away from the corresponding opening portions 109a, 109b, 111b, 112b by the predetermined distance r. In other words, inside diameters of the cut-out portions 103a, 104a, 111a, 112a are set to values larger than the maximum diameter of the screw mechanisms and considering the creeping distance.

Thus, as illustrated in FIG. 17B, a distance G from the screw head 120b (or the nut 121) to a contour portion of the cut-out portion 104a or the cut-out portion 112a can be equal to or longer than the length required as the creeping distance. Similarly, as illustrated in FIG. 17C, a distance G from the screw head 122b (or the nut 123) to a contour portion of the cut-out portion 103a or the cut-out portion 111a can be equal to or longer than the length required as the creeping distance. Because the cut-out portions 103a, 104a, 111b, 112b have the arc shapes, and the opening portions 109a, 109b, 111a, 112a are respectively disposed at centers of the arc shapes, the distance G can be the minimum, and areas of the conductor parts can be increased for it. Because cross-sectional areas of the conductor parts and contact areas of the conductor parts can be increased, a wiring resistance can be reduced, and the connection structure can cope with a larger electric current.

The screw heads 120b, 122b of the bolts 120, 122 and the nuts 121, 123 may have polygonal shapes, such as hexagonal shape, as long as the creeping distance is secured. When the screw heads 120b, 122b of the bolts 120, 122 and the nuts 121, 123 have circular shapes, the maximum diameters from center axes of the screw mechanisms can be constant. Thus, in the case where the screw mechanism are made of conductive material, a circular shape is more preferable because the creeping distance can be uniformly secured. In other words, in a polygonal shape, the creeping distance decreases at corner portions. Thus, a circular shape is more preferable. Specifically, a circular shape is preferable between the positive electrode terminal 103 and the screw head 120b and between the negative electrode terminal 104 and the screw head 122b where the creeping distance become issues. Thus, in the present embodiment, the screw heads 120b, 122b have circular shapes, and hexagonal holes into which hexagonal wrenches are to be fitted are formed at center portions.

By the above-described structure, the connection structure of the semiconductor module 101 according to the present embodiment is formed. In this way, the positive electrode terminal 103 and the negative electrode terminal 104 in the semiconductor module 101 is formed of the plate-shaped conductor 106 as the parallel conductor, and the positive electrode side connection terminal 111 and the negative electrode side connection terminal 112 in the smoothing capacitor 110 are also formed of the parallel conductor. In addition, the positive electrode side wiring is formed by connecting the positive electrode terminal 103 and the positive electrode side connection terminal 111, and the negative electrode side connection wiring is formed by connecting the negative electrode terminal 104 and the negative electrode side connection terminal 112. Thus, in a structure in which a direction of an electric current supplied to the semiconductor module 101 through the positive electrode side wiring and a direction of an electric current flowing from the semiconductor module 101 through the negative electrode side wiring are opposite, the positive electrode side wiring and the negative electrode side wiring can be formed of the parallel conductors, and reduction in inductance can be achieved.

In the above-described structure capable of achieving reduction in inductance, the distances of the connection portion of the positive electrode terminal 103 and the positive electrode side connection terminal 111 and the connection portion (position of the screw mechanism) of the negative electrode terminal 104 and the negative electrode side connection terminal 112 from the resin 102 are substantially equal to each other. Thus, even when a vibration is applied, especially, even when a strong vibration is generated as when mounted in a vehicle, and an expansion and contraction stress is repeatedly generated at the connection portions, the stress does not become large. In other words, because the distances of the connection portions from the resin 102 are equal to each other, expansion and contraction states are similar, there is no difference between expansion and contraction amounts, and a large stress is not generated. Thus, a disconnection due to fatigue can be restricted.

Thus, the connection structure of the semiconductor module 101 can improve the reliability of the connection portions of the positive electrode terminal 103 and the negative electrode terminal 104 while achieving reduction in inductance.

Seventh Embodiment

A seventh embodiment of the present embodiment is described. In the present embodiment, a connection structure of the conductor parts is changed with respect to the sixth embodiment and the other part is similar to the sixth embodiment. Thus, only a part different from the sixth embodiment will be described.

Figure 18:
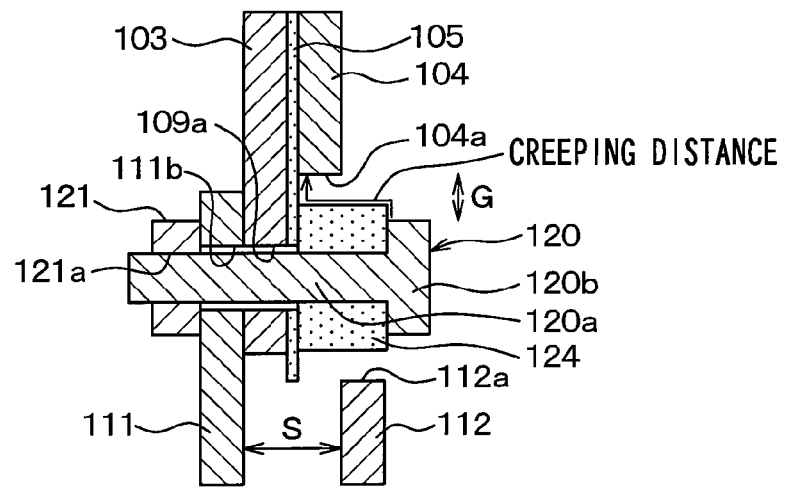
FIG. 18 is a cross-sectional view illustrating a connection structure of a semiconductor module and a smoothing capacitor according to a seventh embodiment of the present disclosure.

In the present embodiment, the connection structure can gain more creeping distance in a case where a screw mechanism is made of conductive material. In other words, in the screw mechanism, an insulation member 124 is disposed on an opposite side of the insulation film 105 from the connection portion of the conductor parts so as to increase a creeping distance from the exposed position of the screw mechanism to the conductor parts of non-connected side. Specifically, as illustrated in FIG. 18, in a case where the positive electrode terminal 103 and the positive electrode side connection terminal 111 are fastened with the bolt 120 and the nut 121, the insulation member 124 is disposed on a side of the screw head 120b of the bolt 120 on an opposite side of the insulation film 105 from the connection portion of the positive electrode terminal 103 and the positive electrode side connection terminal 111. Accordingly, a creeping distance from the screw head 120b to the negative electrode terminal 104 and the negative electrode side connection terminal 112 of the non-connected side can be increased by a height of the insulation member 124. For example, as the insulation member 124, a hollow-shaped insulating spacer made of resin and having a hole portion in which the male screw portion 120a, 122a is inserted can be used.

Although the portion at which the positive electrode terminal 103 and the positive electrode side connection terminal 111 are connected is described in FIG. 18, it is needless to say that the portion at which the negative electrode terminal 104 and the negative electrode side connection terminal 112 are connected is similar. A case where a positional relationship of the bolts 120, 122 and the nuts 121, 123 is opposite is also similar.

In this way, in the case where the screw mechanism is made of conductive material, the creeping distance from the exposed position of the screw mechanism to the conductive parts of the non-connected side can be increased by using the insulation member 124.

Eighth Embodiment

An eighth embodiment of the present disclosure is described. In the present embodiment, a connection structure using screw mechanisms is made more tightly with respect to the sixth embodiment and the other part is similar to the sixth embodiment. Thus, only a part different from the sixth embodiment will be described.

As described in the sixth embodiment, the connections of the conductor parts can be performed using the screw mechanisms (see FIG. 17A through FIG. 17C). However, the connection of the positive electrode terminal 103 and the positive electrode side connection terminal 111 is performed at only one portion using the first screw mechanism constituted of the blot 120 and the nut 121, and the connection of the negative electrode terminal 104 and the negative electrode side connection terminal 112 is also performed at only one portion using the second screw mechanism constituted of the bolt 122 and the nut 123. Thus, a fastening force by the screw mechanisms weakens at positions away from the connection portions, and there is a possibility that contact surfaces of the conductor parts are separated and a contact area cannot be secured.

Thus, in the present embodiment, both of the connection of the positive electrode terminal 103 and the positive electrode side connection terminal 111 and the connection of the negative electrode terminal 104 and the negative electrode side connection terminal 112 are performed using both of the first screw mechanism constituted of the bolt 120 and the nut 121 and the second screw mechanism constituted of the bolt 122 and the nut 123.

Figure 19A:
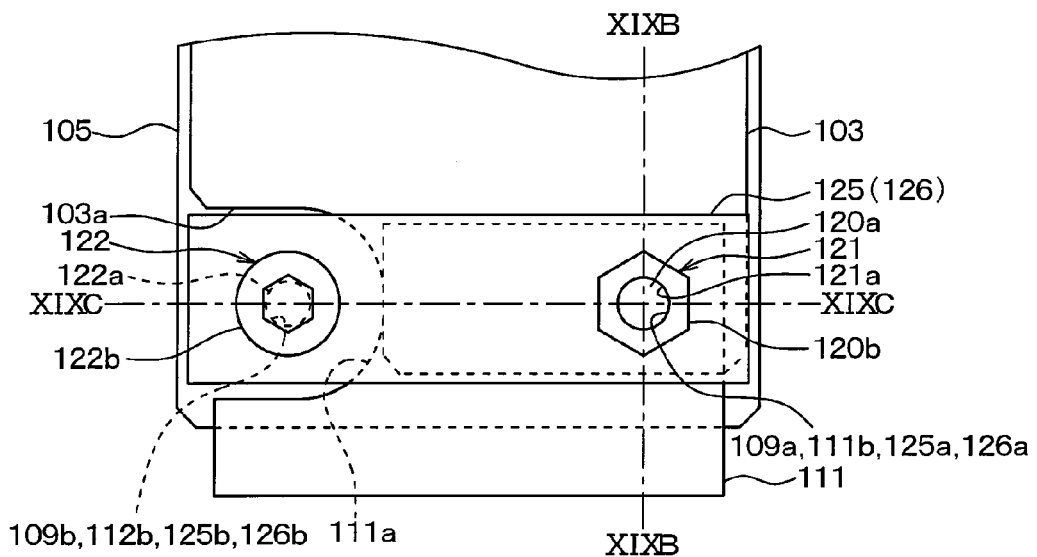
FIG. 19A is a top view of a connection structure of a semiconductor module and a smoothing capacitor according to an eighth embodiment of the present disclosure.
Figure 19B:
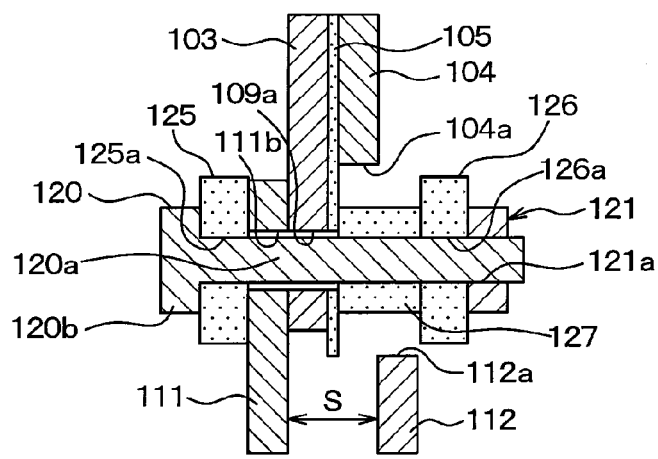
FIG. 19B is a cross-sectional view of the connection structure of the semiconductor module and the smoothing capacitor taken along line XIXB-XIXB in FIG. 19A.
Figure 19C:
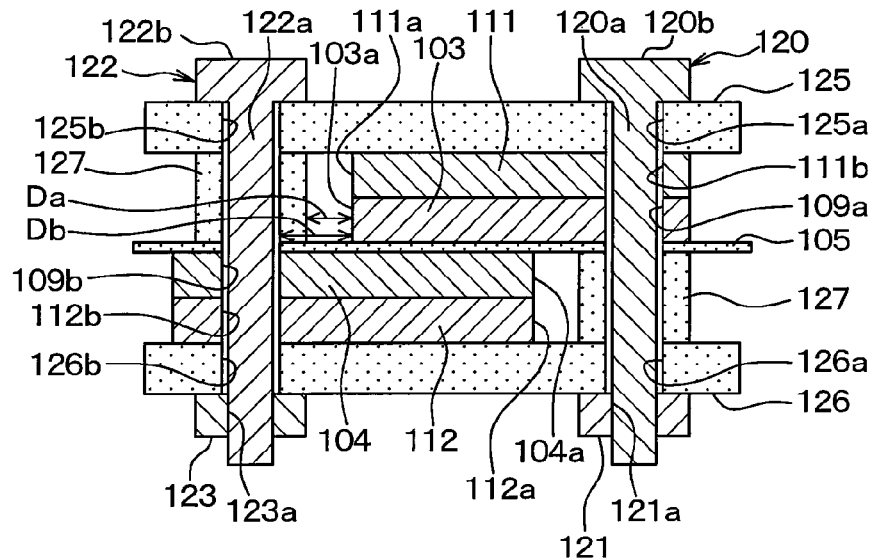
FIG. 19C is a cross-sectional view of the connection structure of the semiconductor module and the smoothing capacitor taken along line XIXC-XIXC in FIG. 19A.

Specifically, as illustrated in FIG. 19A through FIG. 19C, reinforcing plates (first and second reinforcing plates) 125, 126 sandwiching the plate-shaped conductor 106, the positive electrode side connection terminal 111, and the negative electrode side connection terminal 112 from both sides, and spacers 127 sandwiched between the reinforcing plates 125, 126 and the insulation film 105 are provided.

The reinforcing plates 125, 126 are formed, for example, quadrangular plates. In a case where the screw mechanisms are made of conductive material, at least contact portions of the reinforcing plates 125, 126 with the conductive parts are made of insulating material. In a case where the screw mechanisms are made of insulating material, the reinforcing plates 125, 126 are made of conductive material or the insulating material. The reinforcing plates 125, 126 have opening portions 125a, 125b, 126a, 126b at two positions corresponding to the opening portions 109a, 109b, 111b, 112b, and the male screw portions 120a, 122a are respectively inserted.

The spacers 127 are disposed to fill gaps between the reinforcing plates 125, 126 and the insulation film 105, have hollow shapes having holes through which the male screw portions 120a, 122a are inserted, and have thicknesses corresponding to the gaps between the reinforcing plates 125, 126 and the insulation film 105. Although the spacers 127 may be made of either conductive material or insulating material, considering the creeping distance, it is preferable that the spacers 127 are made of insulating material. For example, the creeping distance from the connection portion of the positive electrode terminal 103 and the positive electrode side connection terminal 111 to the negative electrode side wiring is considered. In this case, as illustrated in FIG. 19C, the creeping distance is a distance Da from the cut-out portions 103a, 111a to the spacer 127 in a case where the spacer 127 is made of conductive material, and the creeping distance is a distance Db from the cut-out portions 103a, 111a to the opening portion 109b in a case where the spacer 127 is made of insulating material, and Da<Db. Thus, it is favorable to make the spacers 127 from insulating material when considering the creeping distance.

Using the reinforcing plates 125, 126 and the spacers 127 configured as described above, the reinforcing plates 125, 126 are sandwiched by both of the screw mechanism constituted of the bolt 120 and the nut 121 and the screw mechanism constituted of the bolt 122 and the nut 123. Accordingly, the connection of the positive electrode terminal 103 and the positive electrode side connection terminal 111 and the connection of the negative electrode terminal 104 and the negative electrode side connection terminal 112 can be performed using both of the screw mechanism constituted of the bolt 120 and the nut 121 and the screw mechanism constituted of the bolt 122 and the nut 123. Furthermore, by sandwiching by the whole of the reinforcing plates 125, 126, the connection portions can be connected firmly. Accordingly, the connections at the connection portions can be performed firmly, and the contact areas of the conductive parts can be secured.

Modification of Eighth Embodiment

Figure 20:
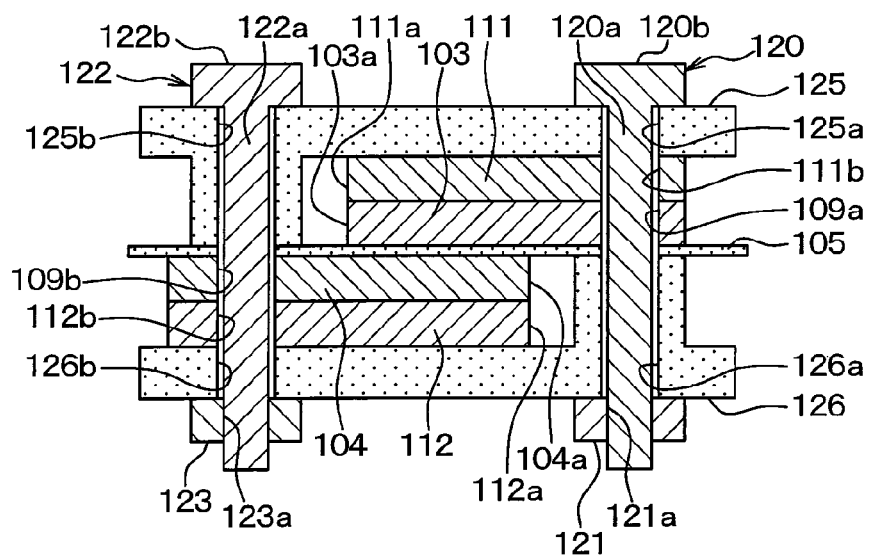
FIG. 20 is a cross-sectional view of a connection structure of a semiconductor module and a smoothing capacitor according to a modification of the eighth embodiment.

In the above-described eighth embodiment, the reinforcing plates 125, 126 and the spacers 127 are formed of different bodies. However, as illustrated in FIG. 20, portions constituting the spacers 127 may be integrated with the reinforcing plates 125, 126. In this case, at least contact portions of the reinforcing plates 125, 126 and the spacers 127 with the conductive parts are formed of insulating material. FIG. 20 shows a cross section corresponding to FIG. 19C.

Other Embodiments

Figure 21:
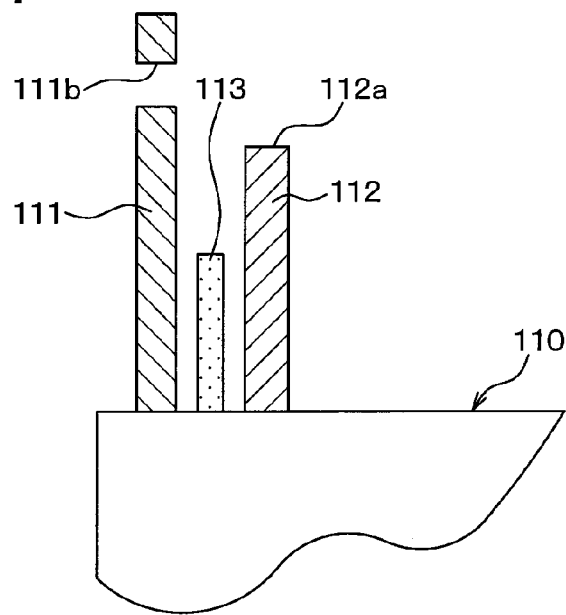
FIG. 21 is a cross-sectional view of a connection portion of a smoothing capacitor according to another embodiment.

Although examples of the structures of the semiconductor module 101 and the smoothing capacitor 110 are described in the above-described embodiments, the above-described structures are only examples and may be changed optionally. For example, the positive electrode side connection terminal 111 and the negative electrode side connection terminal 112 formed to protrude from the smoothing capacitor 110 are bent in the above-described structure, for example, as illustrated in FIG. 21, the positive electrode side connection terminal 111 and the negative electrode side connection terminal 112 may be simply extended straight from the body of the smoothing capacitor 110 In other words, the positive electrode side connection terminal 111 and the negative electrode side connection terminal 112 only need to have portions being the parallel conductor which extend in a direction parallel to the connection portions of the positive electrode terminal 103 and the negative electrode terminal 104. Also in this case, it is preferable that the protruding amount of the insulation portion 113 is reduced so as to prevent an interference of the plate-shaped conductor 106 and the insulation portion 113 when the plate-shaped conductor 106 is sandwiched between the positive electrode side connection terminal 111 and the negative electrode side connection terminal 112.

Although the materials of the screw mechanisms are described in the above-described embodiments, the materials of the bolts 120, 122 and the nuts 121, 123 do not need to be the same, and the whole of the bolts 120, 122 do not need to be made of the same material. When considering the creeping distance, at least portions in the screw mechanisms facing the cut-out portions 103a, 104a, 111a, 112a need to be made of insulating material.

In the first to third and sixth through eighth embodiments, the semiconductor module including bridge circuits for three phases of the U-phase, the V-phase, and the W-phase, that is, the 6-in-1 structure, in which because the upper and lower arms are provided for the respective phases, six arms are modularized in one, is described as an example. However, this indicates only one example, a 2-in-1 structure in which only one phase is modularized, or a 4-in-1 structure in which a bridge circuit for 2 phases, such as an H bridge circuit, is modularized may also be employed. The fourth embodiment is also not limited to the 2-in-1 structure and may also have a 6-in-1 structure or a 4-in-1 structure.

As the semiconductor switching elements 51a-56a described in the above-described embodiments, any elements, such as IGBTs or MOSFETs may be used. As the rectifiers 51b-51f, either PN diodes or Schottky diodes may be applied.

In the above-described embodiments, as the connected object having the connection portion connected with the semiconductor module 101, the smoothing capacitor 110 is taken as an example. However, the above-described connection structure can also be applied to other connected object. For example, there is a case where a wiring part connected to a direct current power source is formed of a connection portion such as a bus bar.

The invention claimed is:

1. A semiconductor device comprising:
an upper arm and a lower arm each including a semiconductor chip in which a semiconductor switching element is formed, the semiconductor chip having a front surface and a rear surface;
heat radiation plates respectively disposed on a front surface side and a rear surface side of the semiconductor chip in each of the upper arm and the lower arm;
a lead-out conductor part including a parallel conductor that includes a positive electrode terminal, a negative electrode terminal, and an insulating film, the positive electrode terminal connected to the heat radiation plate connected to a positive electrode side of the semiconductor chip in the upper arm, the negative electrode terminal connected to the heat radiation plate connected to a negative electrode side of the semiconductor chip in the lower arm, the insulation film disposed between the positive electrode terminal and the negative electrode terminal, the positive electrode terminal and the negative electrode terminal disposed oppositely while sandwiching the insulation film; and
a resin mold part configured in such a manner that the resin mold part covers the semiconductor chips while exposing surfaces of the heat radiation plates opposite to the semiconductor chips, a part of the positive electrode terminal, and a part of the negative electrode terminal, and at least a part of the parallel conductor in the lead-out conductor part enters the resin mold part.

2. The semiconductor device according to claim 1, wherein the heat radiation plates includes an upper heat radiation plate disposed on the front surface side of the semiconductor chips and a lower heat radiation plate disposed on the rear surface side of the semiconductor chips,
the upper heat radiation plate of the upper arm and the lower heat radiation plate of the lower arm are electrically connected through an upper and lower arm relay electrode, the positive electrode terminal is connected to the lower heat radiation plate of the upper arm, and the negative electrode terminal is connected to the upper heat radiation plate of the lower arm,
an electric current, which flows from the positive electrode terminal to the negative electrode terminal at a moment when one of the semiconductor switching elements in one of the upper arm and the lower arm is switched, passes through a path in which the electric current flows through the upper arm in order of the lower heat radiation plate, the semiconductor chip, and the upper heat radiation plate, then flows to the lower arm through the upper and lower arm relay electrode, flows through the lower arm in order of the lower heat radiation plate, the semiconductor chip, and the upper heat radiation plate, and then flows to the negative electrode terminal, and
in at least one or more portions in the path, the electric current flows in opposite directions.

3. The semiconductor device according to claim 1, wherein the lead-out conductor part is formed of a plate-shaped conductor in which the positive electrode terminal and the negative electrode terminal are formed into plate shapes, and the plate-shaped conductor protrudes from the resin mold part in a direction same as an arrangement direction of the upper arm and the lower arm,
in the plate-shaped conductor, the insulation film is larger than the positive electrode terminal and the negative electrode terminal so that the insulation film sticks out from the positive electrode terminal and the negative electrode terminal,
the amount of the insulation film sticking out from the positive electrode terminal and the negative electrode terminal is larger at a portion of the plate-shaped conductor protruding and exposed from the resin mold part compared with a portion of the plate-shaped conductor covered by the resin mold part.

4. The semiconductor device according to claim 1, wherein the heat radiation plates includes an upper heat radiation plate disposed on the front surface side of the semiconductor chips and a lower heat radiation plate disposed on the rear surface side of the semiconductor chips,
the upper heat radiation plate of the upper arm and the upper heat radiation plate of the lower arm are connected, the lead-out conductor part is disposed between a side surface of the lower heat radiation plate of the upper arm and a side surface of the lower heat radiation plate of the lower arm, the positive electrode terminal is connected to the side surface of the lower heat radiation plate of the upper arm and the negative electrode terminal is connected to the side surface of the lower heat radiation plate of the lower arm, and
an electric current, which flows from the positive electrode terminal to the negative electrode terminal at a moment when one of the semiconductor switching elements in one of the upper arm and the lower arm is switched, passes through a path in which the electric current flows through the upper arm in order of the lower heat radiation plate, the semiconductor chip, and the upper heat radiation plate, then flows through the lower arm in order of the lower heat radiation plate, the semiconductor chip, and the upper heat radiation plate, and then flows to the negative electrode terminal.

5. The semiconductor device according to claim 1, wherein depressed portions are provided at outer edge portions of surfaces of the heat radiation plates exposed from the resin mold part.

6. The semiconductor device according to claim 5, wherein areas of the surfaces of the heat radiation plates exposed from the resin mold part inside the depressed portions are larger than areas after diffusion when heat from the semiconductor chips diffuses at an angle of 45 degrees.

7. The semiconductor device according to claim 1, wherein the positive electrode terminal and the negative electrode terminal are formed separately from the heat radiation plates.

8. The semiconductor device according to claim 1, wherein the positive electrode terminal is integrally formed with the heat radiation plate connected to the positive electrode side of the semiconductor chip in the upper arm, and the negative electrode terminal is integrally formed with the heat radiation plate connected to the negative electrode side of the semiconductor chip in the lower arm.

9. The semiconductor device connection structure according to claim 1, further comprising:
   a first and second reinforcing plates disposed on both sides sandwiching the plate-shaped conductor, the positive electrode side connection terminal and the negative electrode side connection terminal; and
   a spacer filling gaps between the first and second reinforcing plates and insulation film, wherein
   the first and second reinforcing plates have opening portions through which male screw portions of both of the first screw mechanism and the second screw mechanism pass, and both of a connection of the positive electrode terminal and the positive electrode side connection terminal and a connection of the negative electrode terminal and the negative electrode side connection terminal are performed by sandwiching the first and second reinforcing plates by both of the first screw mechanism and the second screw mechanism.

10. A semiconductor device connection structure comprising:
    a semiconductor device including a plate-shaped conductor and a semiconductor switching element, the plate-shaped conductor formed as a parallel conductor by oppositely disposing and bonding a positive electrode terminal and a negative electrode terminal while sandwiching an insulation film, the semiconductor device modularized with a resin in such a manner that the plate-shaped conductor is partially exposed and the semiconductor switching element is covered; and
    a connected object including a positive electrode side connection terminal and a negative electrode side connection terminal respectively connected with the positive electrode terminal and the negative electrode terminal included in the plate-shaped conductor, the positive electrode side connection terminal and the negative electrode side connection terminal including a parallel conductor that is constituted of portions extending in a direction parallel to connection portions of the positive electrode terminal and the negative electrode terminal, wherein
    the positive electrode terminal and the negative electrode terminal are exposed from the resin by partially protruding from the resin and when a direction in which the positive electrode terminal and the negative electrode terminal protrude from the resin is defined as a protruding direction and a direction perpendicular to the protruding direction is defined as a width direction, cut-out portions are respectively formed at portions of the positive electrode terminal and the negative electrode terminal at a predetermined distance from the resin in the protruding direction, the cut-out portion of the positive electrode terminal and the cut-out portion of the negative electrode terminal are formed in opposite directions in the width direction,
    in the portions of the positive electrode side connection terminal and the negative electrode side connection terminal becoming the parallel conductor, cut-out portions corresponding to the cut-out portions respectively formed in the positive electrode terminal and the negative electrode terminal are formed,
    in the width direction, a side of the positive electrode terminal opposite to the cut-out portion of the positive electrode terminal and a side of the positive electrode side connection terminal opposite to the cut-out portion of the positive electrode side connection terminal are connected, and a side of the negative electrode terminal opposite to the cut-out portion of the negative electrode terminal and a side of the negative electrode side connection terminal opposite to the cut-out portion of the negative electrode side connection terminal are connected.

11. The semiconductor device connection structure according to claim 10, wherein
    a first opening portion is formed at positions in the positive electrode terminal and the insulation film corresponding to the cut-out portion of the negative electrode terminal,
    a second opening portion is formed at positions of the negative electrode terminal and the insulation film corresponding to the cut-out portion of the positive electrode terminal,
    a third opening portion is formed at a position in the positive electrode side connection terminal corresponding to the first opening portion,
    a fourth opening portion is formed at position in the negative electrode side connection terminal corresponding to the second opening portion,
    the positive electrode terminal and the positive electrode side connection terminal are connected while matching the positions of the first opening portion and the third opening portion, and
    the negative electrode terminal and the negative electrode side connection terminal are connected while matching the positions of the second opening portion and the fourth opening portion.

12. The semiconductor device connection structure according to claim 11, wherein
    the positive electrode terminal and the positive electrode side connection terminal are sandwiched by a first screw mechanism through the first opening portion and the third opening portion, and
    the negative electrode terminal and the negative electrode side connection terminal are sandwiched by a second screw mechanism through the second opening portion and the fourth opening portion.

13. The semiconductor device connection structure according to claim 12, wherein
    the cut-out portion formed in the positive electrode terminal has an arc shape centered on the second opening portion and having an inner diameter larger than a maximum diameter of the second screw mechanism,
    the cut-out portion formed in the negative electrode terminal has an arc shape centered on the first opening portion and having an inner diameter larger than a maximum diameter of the first screw mechanism,
    the cut-out portion formed in the positive electrode side connection terminal has an arc shape centered on the fourth opening portion and having an inner diameter larger than the maximum diameter of the second screw mechanism, and
    the cut-out portion formed in the negative electrode side connection terminal has an arc shape centered on the third opening portion and having an inner diameter larger than the maximum diameter of the first screw mechanism.

14. The semiconductor device connection structure according to claim 12, wherein
    an insulation member is disposed on a side of the insulation film opposite to the positive electrode terminal and the positive electrode side connection terminal, and the insulation member is also sandwiched by the first screw mechanism, and an insulation member is also disposed on a side of the insulation film opposite to the negative electrode terminal and the negative electrode side connection terminal, and the insulation member is also sandwiched by the second screw mechanism.

15. The semiconductor device connection structure according to claim 10, wherein
in the width direction, the insulation film is larger than the positive electrode terminal and the negative electrode terminal, and the positive electrode terminal and the negative electrode terminal are located inside the insulation film.

16. A semiconductor device to which the connection structure according to claim 10 is applied.

* * * * *